United States Patent
Otsuki

(10) Patent No.: US 8,244,513 B2
(45) Date of Patent: Aug. 14, 2012

(54) SIMULATION EXECUTION APPARATUS AND METHOD WITH CYCLICITY DETECTION MECHANISM AND COMPUTER READABLE MEDIUM

(75) Inventor: Tomoshi Otsuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 848 days.

(21) Appl. No.: 11/941,752

(22) Filed: Nov. 16, 2007

(65) Prior Publication Data

US 2008/0177524 A1    Jul. 24, 2008

(30) Foreign Application Priority Data

Jan. 23, 2007   (JP) .................................. 2007-12891

(51) Int. Cl.
*G06F 17/50* (2006.01)

(52) U.S. Cl. ......................... 703/15; 714/741; 716/106

(58) Field of Classification Search .............. 703/13–16, 703/4; 714/741, 34; 716/2, 106
See application file for complete search history.

(56) References Cited

U.S. PATENT DOCUMENTS

| | | | | |
|---|---|---|---|---|
| 5,781,718 | A * | 7/1998 | Nguyen ........................... | 714/33 |
| 6,295,517 | B1 * | 9/2001 | Roy et al. ......................... | 703/15 |
| 6,473,727 | B1 * | 10/2002 | Kirsch et al. .................... | 703/28 |
| 7,328,429 | B2 * | 2/2008 | Hooper et al. .................. | 717/128 |
| 7,826,517 | B2 * | 11/2010 | Kim et al. ....................... | 375/148 |
| 2006/0149526 | A1 | 7/2006 | Torossian et al. | |
| 2007/0129925 | A1 | 6/2007 | Otsuki et al. | |

FOREIGN PATENT DOCUMENTS

JP         2005-321848         11/2005

* cited by examiner

*Primary Examiner* — Russell Frejd

(74) *Attorney, Agent, or Firm* — Turocy & Watson, LLP

(57) ABSTRACT

There is provided with simulation execution apparatus including: a receiving unit configured to receive a cyclic signal; registers; a simulation execution unit configured to execute simulation of a logic circuit model which operates with the use of the cyclic signal and the registers; a counter configured to count time based on the cyclic signal; a register value monitoring unit configured to monitor the values of the registers; a register data recording unit configured to record in a storage, register data made up of the values of the registers in association with the time of the counter when the value of at least one of the registers is changed; a cyclicity detection unit configured to detect a cyclicity of the register data based on the storage; and a stop unit configured to give a stop instruction signal which instructs stop of the simulation execution to the simulation execution unit.

21 Claims, 27 Drawing Sheets

```
module Divider (clk,divide_clk)

reg [1:0] cnt;
reg [1:0] cnt_next;

always @ (posedge clk or posedge RESET)
  if (RESET == 0) {
    cnt <= cnt_next;
  } else {
    cnt <= 0;
  }
end assign cnt_next = cnt + 1;
assign divide_clk = cnt[1];
```

(A)

```
module Counter (divide_clk, RESET, output)

reg [1:0] divide_cnt;
reg [1:0] divide_cnt_next;

always @ (posedge divide_clk or posedge RESET)
  if (RESET == 0) {
    divide_cnt <= divide_cnt_next;
  } else {
    divide_cnt <= 0;
  }
  if (divide_cnt == 3) {
    output <= 1;
  } else {
    output <= 0;
  }
end assign divide_cnt_next=divide_cnt+1;
end
```

```
module clk_generator (clk)
always begin
    clk <= ~clk;
    #1
end
end
```

FIG. 4

| TIME | clk | RESET | cnt (2bit) | cnt_next (2bit) | divide_clk | divide_cnt (2bit) | divide_cnt_next (2bit) | output |
|---|---|---|---|---|---|---|---|---|
| time=0 | 1 | 0 | 0 | 1 | 0 | 0 | 1 | 0 |
| time=2 | 1 | 0 | 1 | 2 | 0 | 0 | 1 | 0 |
| time=4 | 1 | 0 | 2 | 3 | 1 | 1 | 2 | 0 |
| time=6 | 1 | 0 | 3 | 0 | 1 | 1 | 2 | 0 |
| time=8 | 1 | 0 | 0 | 1 | 0 | 1 | 2 | 0 |
| time=10 | 1 | 0 | 1 | 2 | 0 | 1 | 2 | 0 |
| time=12 | 1 | 0 | 2 | 3 | 1 | 2 | 3 | 0 |
| time=14 | 1 | 0 | 3 | 0 | 1 | 2 | 3 | 0 |
| time=16 | 1 | 0 | 0 | 1 | 0 | 2 | 3 | 0 |
| time=18 | 1 | 0 | 1 | 2 | 0 | 2 | 3 | 0 |
| time=20 | 1 | 0 | 2 | 3 | 1 | 3 | 0 | 1 |
| time=22 | 1 | 0 | 3 | 0 | 1 | 3 | 0 | 1 |
| time=24 | 1 | 0 | 0 | 1 | 0 | 3 | 0 | 1 |
| time=26 | 1 | 0 | 1 | 2 | 0 | 3 | 0 | 1 |
| time=28 | 1 | 0 | 2 | 3 | 1 | 0 | 1 | 0 |
| time=30 | 1 | 0 | 3 | 0 | 1 | 0 | 1 | 0 |
| time=32 | 1 | 0 | 0 | 1 | 0 | 0 | 1 | 0 |
| time=34 | 1 | 0 | | | | | | |
| time=36 | 1 | 0 | | | | | | |

CYCLE 32 IS DETECTED, AND WHOLE CIRCUIT STOPS

FIG. 10

| TIME | clk | RESET | cnt (2bit) | cnt_next (2bit) | divide_clk | divide_cnt (2bit) | divid_cnt _next(2bit) | output |
|---|---|---|---|---|---|---|---|---|
| time=0 | 1 | 0 | 0 | 1 | 0 | 0 | 1 | 0 |
| time=2 | 1 | 0 | 1 | 2 | 0 | 0 | 1 | 0 |
| time=4 | 1 | 0 | 2 | 3 | 1 | 1 | 2 | 0 |
| time=6 | 1 | 0 | 3 | 0 | 1 | 1 | 2 | 0 |
| time=8 | 1 | 0 | 4 | 1 | 0 | 1 | 2 | 0 |
| ... | | | | | | | | |
| time=32 | 1 | 0 | 0 | 1 | 0 | 0 | 1 | 0 |
| ... | | | | | | | | |
| time=100 | 1 | 0 | 2 | 3 | 1 | 1 | 2 | 0 |

WHOLE CIRCUIT STOPS AT AND AFTER time=32

FIG. 11

```
module output (output)

always
   #20
   output <=1;
   #8
   output <=0;
   #4
end
```

FIG. 15

R={divide_clk, cnt_next, divide_cnt_next}

| TIME | clk | RESET | cnt (2bit) | cnt_next (2bit) | divide_clk | divide_cnt (2bit) | divide_cnt_next (2bit) | Output |
|---|---|---|---|---|---|---|---|---|
| time=0 | 1 | 0 | | 1 | 0 | | 1 | |
| time=2 | 1 | 0 | | 2 | 0 | | 1 | |
| time=4 | 1 | 0 | | 3 | 1 | | 2 | |
| time=6 | 1 | 0 | | 0 | 1 | | 2 | |
| time=8 | 1 | 0 | | 1 | 0 | | 2 | |
| time=10 | 1 | 0 | | 2 | 0 | | 2 | |
| time=12 | 1 | 0 | | 3 | 1 | | 3 | |
| time=14 | 1 | 0 | | 0 | 1 | | 3 | |
| time=16 | 1 | 0 | | 1 | 0 | | 3 | |
| time=18 | 1 | 0 | | 2 | 0 | | 3 | |
| time=20 | 1 | 0 | | 3 | 1 | | 0 | |
| time=22 | 1 | 0 | | 0 | 1 | | 0 | |
| time=24 | 1 | 0 | | 1 | 0 | | 0 | |
| time=26 | 1 | 0 | | 2 | 0 | | 0 | |
| time=28 | 1 | 0 | | 3 | 1 | | 1 | |
| time=30 | 1 | 0 | | 0 | 1 | | 1 | |
| time=32 | 1 | 0 | | 1 | 0 | | 1 | |
| time=34 | 1 | 0 | | | | | | |
| time=36 | 1 | 0 | | | | | | |

CYCLE 32 IS DETECTED, AND WHOLE CIRCUIT STOPS

FIG. 24

| TIME | clk | RESET | cnt (2bit) | cnt_next (2bit) | divide_clk | divide_cnt (2bit) | divide_cnt_next (2bit) | output |
|---|---|---|---|---|---|---|---|---|
| time=0 | 1 | 0 | 0 | 1 | 0 | 0 | 1 | 0 |
| time=2 | 1 | 0 | 1 | 2 | 0 | 0 | 1 | 0 |
| time=4 | 1 | 0 | 2 | 3 | 1 | 1 | 2 | 0 |
| time=6 | 1 | 0 | 3 | 0 | 1 | 1 | 2 | 0 |
| time=8 | 1 | 0 | 0 | 1 | 0 | 1 | 2 | 0 |
| time=10 | 1 | 0 | | | | 1 | 2 | 0 |
| time=12 | 1 | 0 | | | | 2 | 3 | 0 |
| time=14 | 1 | 0 | | | | 2 | 3 | 0 |
| time=16 | 1 | 0 | | | | 2 | 3 | 0 |
| time=18 | 1 | 0 | | | | 2 | 3 | 0 |
| time=20 | 1 | 0 | | | | 3 | 0 | 1 |
| time=22 | 1 | 0 | | | | 3 | 0 | 1 |
| time=24 | 1 | 0 | | | | 3 | 0 | 1 |
| time=26 | 1 | 0 | | | | 3 | 0 | 1 |
| time=28 | 1 | 0 | | | | 0 | 1 | 0 |
| time=30 | 1 | 0 | | | | 0 | 1 | 0 |
| time=32 | 1 | 0 | | | | 0 | 1 | 0 |
| time=34 | 1 | 0 | | | | | | |
| time=36 | 1 | 0 | | | | | | |

PART OF CIRCUIT STOPS AT AND AFTER time=8

WHOLE CIRCUIT STOPS

FIG. 27

```
module Output_divide_clk (divide_clk)

always
        #4
        divide_clk<=1;
        #4
        divide_clk<=0;
    end
end
```

```
module Counter (divide_clk, RESET, output)

reg [1:0] divide_cnt;
reg [1:0] divide_cnt_next;

always @ (posedge divide_clk or posedge RESET)
    if (RESET ==0) {
        divide_cnt <=divide_cnt_next;
    } else {
        divide_cnt <=0;
    }
    if (divide_cnt == 3) {
        output <=1;
    } else {
        output <=0;
    }
end assign divide_cnt_next=divide_cnt+1;

end
```

FIG. 28

SIMULATION EXECUTION APPARATUS AND METHOD WITH CYCLICITY DETECTION MECHANISM AND COMPUTER READABLE MEDIUM

CROSS-REFERENCE TO RELATED APPLICATIONS

This application is based upon and claims the benefit of priority from the prior Japanese Patent Applications No. 2007-12891 filed on Jan. 23, 2007, the entire contents of which are incorporated herein by reference.

BACKGROUND OF THE INVENTION

1. Field of the Invention

The present invention relates to a simulation execution apparatus for executing simulation of a logic circuit model expressed in a hardware description language or the like, and a method and a computer readable medium storing program therefor.

2. Related Art

Recently, in design and manufacture of a large-scale logic circuit such as LSI (large-scale integration), it is common that hardware is described in a language called a hardware description language (HDL) to manufacture actual hardware such as LSI from the written HDL.

Meanwhile, recently, in embedded devices for mobile phones and the like, software is more and more larger-scaled while the development cycle is shorter and shorter, so that the speed of development and tests cannot keep up with the situation. Therefore, the importance of simulation execution of an HDL, which enables efficient logic verification and evaluation to be done before manufacture of hardware, is increasing.

As the HDL, for example, Verilog HDL, VHDL and the like are often used. There may be a case where, in order to execute simulation of the HDL, an equivalent code (for example, a C code) is manually created by a man. Because a man can understand the intention of specifications and HDL, a high-speed code suitable for simulation execution may be created.

As a tool for automatically performing simulation execution, tools such as iverilog, verilator and NC-verilog for Verilog HDL are known. Basically, these simulation execution tools faithfully execute the circuit operation expressed in an HDL along a time axis. However, a logic circuit is commonly designed and described on the assumption of parallelism and a small storage area. Therefore, in the case of performing faithful simulation execution in an environment with an operation part with low parallelism and a large storage area, such as a PC (personal computer), the processing tends to be redundant and wasteful.

Therefore, various means have been devised in order to increase the speed of simulation execution. For example, JP-A 2005-321848 (Kokai) discloses a method for speed-up in which static analysis of an HDL is performed before simulation execution to delete unnecessary description. In verilator described above, it is possible to, by converting an HDL to an equivalent C code once, utilize optimization by a compiler. As a method for semi-automation, a method is also known in which the bottleneck part of simulation execution time is automatically identified and is edited by a man to increase the execution speed, as seen in NC-verilog described above.

When simulation execution of a logic circuit described in an HDL is performed, all of the following three viewpoints are important: accuracy of the operation of simulation execution, time and effort required for creation, and execution speed.

In the case of a man manually creating an execution code and the case of semi-automatically creating an execution code, as described above, it is possible to create a high-speed execution code if the creator is sufficiently skilled. However, much time and effort is required, and there is a possibility that the operation may be inaccurate because creation is manually performed.

On the other hand, in the case of automatically creating a simulation execution code, the accuracy of simulation execution is ensured, and the time and effort required for creation is little in many cases. However, it is difficult to increase the execution speed.

As one of the causes of the difficulty of increasing the execution speed, in the existing methods such as iverilog and verilator, it is given that execution time is wastefully consumed because simulation execution of actual circuit operation is faithfully performed, and a repeated operation is also faithfully executed.

In JP-A 2005-321848 (Kokai) described above, a method for detecting the cyclicity of circuit operation by static analysis is described. However, it is necessary to register a cycling pattern in advance, which requires much time and effort.

As described above, there is still room for improvement of the method for performing simulation execution at a high speed.

SUMMARY OF THE INVENTION

According to an aspect of the present invention, there is provided with a simulation execution apparatus comprising:
a receiving unit configured to receive a cyclic signal;
a plurality of registers;
a simulation execution unit configured to execute simulation of a logic circuit model which operates with the use of the cyclic signal and the registers;
a counter configured to count time based on the cyclic signal;
a register value monitoring unit configured to monitor the values of the registers;
a register data recording unit configured to record in a storage, register data made up of the values of the registers in association with the time of the counter when the value of at least one of the registers is changed;
a cyclicity detection unit configured to detect a cyclicity of the register data based on the storage; and
a stop unit configured to give a stop instruction signal instructing stop of the simulation to the simulation execution unit when the cyclicity of the register data is detected.

According to an aspect of the present invention, there is provided with a simulation execution method comprising:
receiving a cyclic signal;
executing simulation of a logic circuit model which operates with the use of the cyclic signal and a plurality of registers;
counting time based on the cyclic signal;
monitoring the values of the registers;
recording in a storage, register data made up of the values of the registers in association with the time of the counter on a memory when the value of at least one of the registers is changed;
detecting a cyclicity of the register data based on the storage; and
stopping the executing of the simulation.

According to an aspect of the present invention, there is provided with a computer readable medium for storing a computer program for causing a computer to execute instructions to perform the steps of:
  receiving a cyclic signal;
  executing simulation of a logic circuit model which operates with the use of the cyclic signal and a plurality of registers;
  counting time based on the cyclic signal;
  monitoring the values of the registers;
  recording in a storage, register data made up of the values of the registers in association with the time of the counter on a memory when the value of at least one of the registers is changed;
  detecting a cyclicity of the register data based on the storage; and
  stopping the executing of the simulation.

BRIEF DESCRIPTION OF THE DRAWINGS

FIG. 3 is a diagram showing an example of logic circuit description;

FIG. 4 is a diagram showing an example of logic circuit description;

FIG. 10 is a diagram illustrating an example of cyclicity detection processing;

FIG. 11 is a diagram illustrating an example of the register value recovery processing;

FIG. 15 is a diagram showing an example description of the processing by an output mechanism;

FIG. 24 is a diagram showing an example of detection of a cycle according to a fourth embodiment;

FIG. 27 is a diagram showing an example of detection of a cycle; and

FIG. 28 shows an example of description of the processing to be subsequently performed if a part of a circuit stops.

DETAILED DESCRIPTION OF THE INVENTION (First Embodiment)

Figure 1:
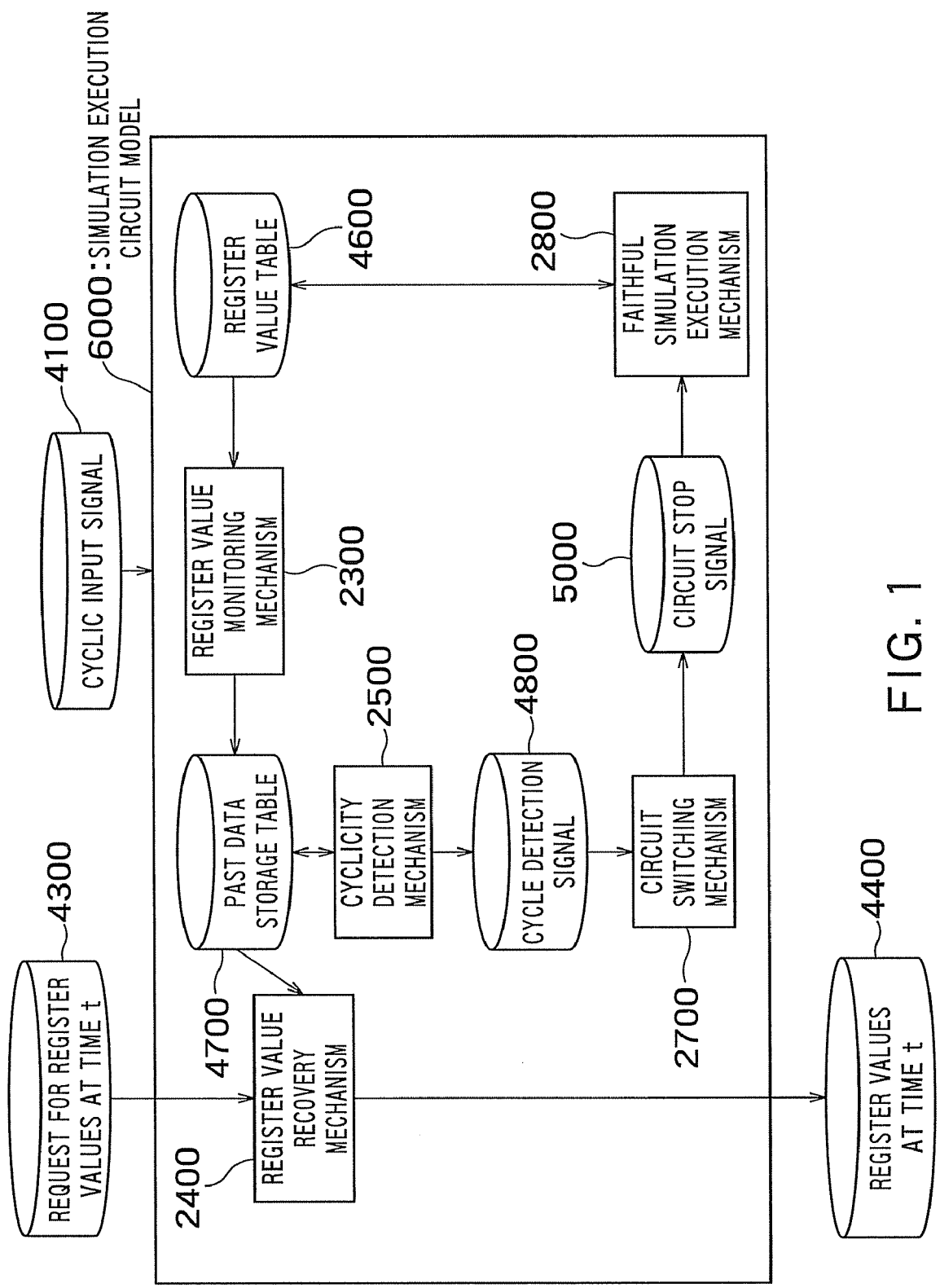
FIG. 1 is a diagram showing the configuration of a simulation execution circuit model according to a first embodiment.

FIG. 1 is a block diagram showing the configuration of a simulation execution circuit model (a simulation execution apparatus) 6000 as a first embodiment of the present invention.

The simulation execution circuit model 6000 is provided with a faithful simulation execution mechanism 2800, a register value table 4600, a register value monitoring mechanism 2300, a past data storage table 4700, a cyclicity detection mechanism 2500, a circuit switching mechanism 2700 and a register value recovery mechanism 2400.

Figure 2:
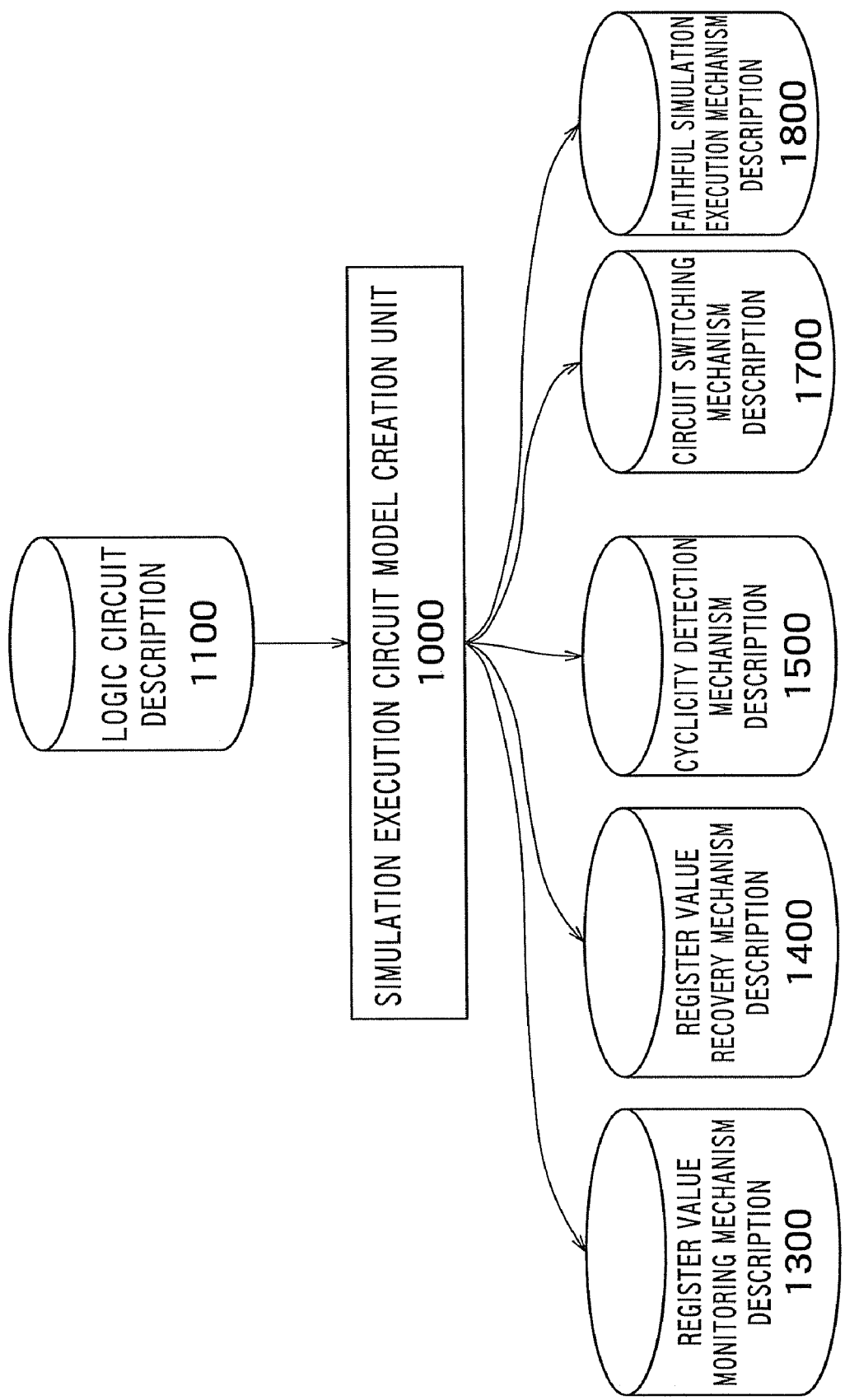
FIG. 2 is a diagram showing an example of a method for automatically creating the simulation execution circuit model in FIG. 1.

In the mechanisms in FIG. 1, descriptions corresponding to them are prepared as register value monitoring mechanism description 1300, register value recovery mechanism description 1400, cyclicity detection mechanism description 1500, circuit switching mechanism description 1700 and faithful simulation execution mechanism description 1800, respectively (see FIG. 2) which are executed to realize the mechanisms. The register value monitoring mechanism description 1300, the register value recovery mechanism description 1400, the cyclicity detection mechanism description 1500, the circuit switching mechanism description 1700 and the faithful simulation execution mechanism description 1800 may be automatically generated by analyzing logic circuit description 1100 (see FIG. 3) to be targeted by simulation execution or may be created by a user based on the logic circuit description 1100 in advance.

In the case of automatic generation, the logic circuit description 1100 is given to a simulation execution circuit model creation unit 1000 of a simulation execution circuit model creation apparatus (not shown) prepared in advance, and such register value monitoring mechanism description 1300, register value recovery mechanism description 1400, cyclicity detection mechanism description 1500, circuit switching mechanism description 1700 and faithful simulation execution mechanism description 1800 as realize the register value monitoring mechanism 2300, the register value recovery mechanism 2400, the cyclicity detection mechanism 2500, the circuit switching mechanism 2700 and the faithful simulation execution mechanism 2800, respectively, are automatically generated.

The register value monitoring mechanism description 1300, the register value recovery mechanism description 1400, the cyclicity detection mechanism description 1500, the circuit switching mechanism description 1700 and the faithful simulation execution mechanism description 1800 generated by the simulation execution circuit model creation unit 1000 operate as the register value monitoring mechanism 2300, the register value recovery mechanism 2400, the cyclicity detection mechanism 2500, the circuit switching mechanism 2700 and the faithful simulation execution mechanism 2800, respectively, when simulation execution is performed. The faithful simulation execution mechanism 2800 has a function of faithfully executing the above described logic circuit description 1100 in a time series. The faithful simulation execution mechanism 2800 can be realized by a method equivalent to that of an existing tool such as iverilog, verilator and NC-verilog.

FIG. 3 shows an example of the logic circuit description 1100 of a timer circuit. FIG. 3(A) corresponds to the circuit description of a frequency divider (a module Divider), and FIG. 3(B) corresponds to the circuit description of a counter (a module Counter). The circuit description of the timer circuit is configured by both of these circuit descriptions. The logic circuit description 1100 may be described in an HDL other than Verilog HDL. It may also be described by other different graph data having information equivalent to an HDL.

As shown in FIGS. 3(A) and 3(B), in the timer circuit, the Divider module to which a clock signal ("clk") is inputted divides the frequency of the clock signal, and the Counter module outputs an interrupt signal ("output") with a constant cycle, based on the frequency-divided clock. When a RESET signal changes from 0 to 1, the value of counters ("cnt" and "divide_cnt") is cleared to be 0.

In the circuit descriptions in FIGS. 3(A) and 3(B), "RESET", "cnt", "cnt_next", "divide_clk" "divide_cnt", "divide_cnt_next" and "output" correspond to storage areas of the circuit, and these storage areas of the circuit are referred to as "registers". FIG. 10 to be described later in detail shows how the values of the respective registers change with time.

Here, in the Divider module, "reg [1:0] cnt" means that a register "cnt" corresponding to two bits has been allocated. For example, "cnt[1]" indicates a high-order bit, and "cnt[2]" indicates a low-order bit. Furthermore, "posedge_clk" means the point of time when a clock rises (for example, the value changes from 0 to 1), and "posedge_RESET" means the point of time when a RESET signal rises. Furthermore, "assign" means that, if the value on the right-hand side changes, substitution on the left-hand side is to be performed. For example, "assign divide_clk=cnt[1]" means that the high-order bit 1 is to be substituted for "divide_clk" if the register "cnt" becomes 2 (10) or 3 (11), and the high-order bit 0 is to be substituted for "divide_clk" if the register "cnt" becomes 0 (00) or 1 (01).

Each register corresponds to any of a register holding an input signal to the circuit, a register holding an output signal from the circuit and a register holding a signal other those. In the timer circuit, the "RESET" register is the register holding an input signal to the circuit, and the "output" register is the register holding an output signal from the circuit. The "cnt" "cnt_next", "divide_clk" "divide_cnt" and "divide_cnt_next" are the registers holding a signal other than input and output signals.

Furthermore, input signals to the circuit are classified as cyclic input signals and irregular input signals. For example, in the logic circuit description 1100 in FIGS. 3(A) and 3(B), "clk" to be inputted to the Divider module is classified as a cyclic input signal because it repeats a cyclic operation of 1, 0, 1, 0 . . . On the other hand, "RESET" is classified as an irregular input signal because it suddenly changes depending on settings by the user or the like.

The faithful simulation execution mechanism 2800 holds and updates the value of each register in the register value table 4600 while faithfully performing simulation execution based on the logic circuit description 1100 in a time series. That is, the latest register values during simulation execution are held in the register value table 4600. That is, the values of the registers to be handled during simulation execution are stored in the register value table 4600.

Each time a cyclic input signal 4100 changes (each time "clk" rises, in the example in FIG. 3), the register value monitoring mechanism 2300 monitors the value of each register recorded in the register value table 4600. If the value of at least one register is changed, the register value monitoring mechanism 2300 records all the register values in the past data storage table 4700 together with the current time. In order to record the current time, the register value monitoring mechanism 2300 has a counter for counting time based on the cyclic input signal 4100. The cyclic input signal 4100 can be generated, for example, by performing simulation execution of the logic circuit description of a separately prepared clock generator outside the simulation execution circuit model 6000 in FIG. 1. The cyclic input signal 4100 is inputted to the simulation execution circuit model 6000 (especially the register value monitoring mechanism 2300 and the faithful simulation execution mechanism 2800) in FIG. 1. An example of the logic circuit description of the clock generator is shown in FIG. 4. FIG. 4 shows the circuit description of the clock generator circuit ("module clk_generator") made like description in Verilog HDL which is one of HDL's. The clock generator generates a clock signal which rises every two (time units) cycles. The description "~" means that 1 and 0 are reversed, and "#1" means that time is advanced by one unit.

FIG. 10 shows that the value of each register is recorded in the past data storage table 4700 with time as simulation execution of the logic circuit description 1100 is performed by the faithful simulation execution mechanism 2800. Because the value of at least one register is changed every two times, the value of each register is recorded every two times. If registers to be monitored can be limited in advance, only the limited registers are monitored in the register value table 4600. This will be described in a fourth embodiment.

The cyclicity detection mechanism 2500 checks whether or not the current values (register data) of the registers in the register value table 4600 correspond to values (register data) of the registers in the past in the past data storage table 4700, and the time required until they correspond is a multiple of the cycle of the cyclic input signal 4100 (a cyclicity detection condition). That is, it is checked whether or not the register data constituted by the values of the registers is cyclic.

If the above described cyclicity detection condition is satisfied, then it is determined that the operation of the circuit from the current time to the time of the past register values corresponding to the register values in the register value table 4600 is a cyclic operation (that the register data has cyclicity). In this case, a cycle detection signal 4800 is issued to the circuit switching mechanism 2700, and the time of the past register values corresponding to the register values in the register value table 4600 is recorded as cycle start time "Ts", and the current time is recorded as cycle end time "Tg", in the past data storage table 4700. "C=Tg−Ts" corresponds to the cycle. In the example in FIG. 10, the values of the registers at time 0 (the register data at the time 0) and the values of the registers at time 32 (the register data at time 32) are the same, and 32−0=32 is a multiple of 2, which is the cycle of the input signal. Therefore, the cycle is detected as 32, and the times "Ts" and "Tg" are 0 and 32, respectively.

If there are multiple cyclic input signals 4100, it is determined that a cyclic operation exists in the circuit (that the circuit has cyclicity) as far as the difference from the current time is a multiple of the cycles of all the cyclic input signals 4100. It is mathematically assured that, if the difference from the current time is a multiple of the cycles of all the cyclic input signals 4100, the circuit operation performed until the time when an irregular input signal (for example, "RESET") is inputted next is a cyclic operation.

When receiving the cycle detection signal 4800 from the cyclicity detection mechanism 2500, the circuit switching mechanism 2700 transfers a circuit stop signal 5000 to the faithful simulation execution mechanism 2800 that is operating. Receiving the circuit stop signal 5000, the faithful simulation execution mechanism 2800 stops the operation of the timer circuit. That is, it stops the simulation execution of the circuit description of the timer circuit in FIG. 3.

When receiving a request 4300 for the register values at time "t" while the simulation execution is stopped, the register value recovery mechanism 2400 refers to the past data storage table 4700 to identify the position in the cycle corresponding to the time t, acquires the values of the registers (register data) corresponding to the identified position, and outputs them as register values 4400 at the time "t". The register value recovery mechanism 2400 includes, for example, a request signal receiving unit, a register value acquisition unit and an output unit. If the request 4300 for the register values at time "t" is transferred during simulation execution, the values in the register value table 4600 can be immediately outputted.

Figure 5:
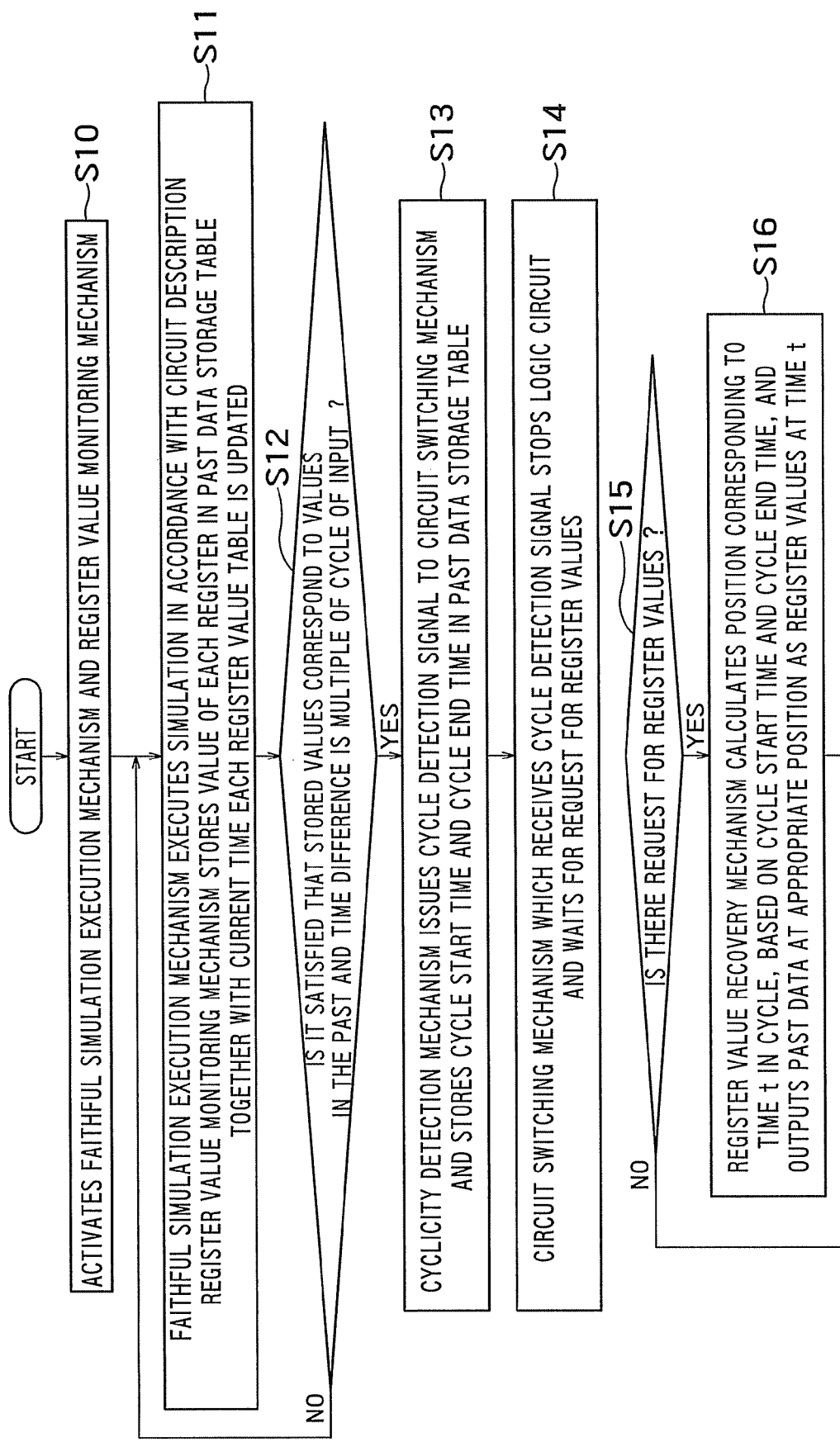
FIG. 5 is a flowchart illustrating the operation performed when simulation execution of the model in FIG. 1 is performed.

FIG. 5 is a flowchart illustrating the operation of the simulation execution circuit model 6000 in FIG. 1.

The faithful simulation execution mechanism 2800 and the register value monitoring mechanism 2300 are activated (S10). The faithful simulation execution mechanism 2800 faithfully simulates the circuit operation in a time series, and the values of the registers are changed (the register value table 4600 is updated) in accordance with the circuit operation. The register value monitoring mechanism 2300 monitors the register value table 4600 based on a cyclic input signal. When the register value table 4600 is updated, the register value monitoring mechanism 2300 stores the register values (register data) in the register value table 4600 in the past data storage table 4700 together with the current time (S11).

The cyclicity detection mechanism 2500 checks whether or not the register values at the current time stored in the past data storage table 4700 correspond to register values in the past, and the difference between the current time and the time of each of the past register values is a multiple of the cycle (the cycle of input) of the cyclic input signal (S12). If this condition is not satisfied (S12: NO), then the flow returns to step S11.

If this condition is satisfied (S12: YES), then the cyclicity detection mechanism 2500 transfers a cycle detection signal 4800, and cycle start time and cycle end time are stored in the past data storage table 4700 (S13).

Receiving the cycle detection signal 4800, the circuit switching mechanism 2700 sends a circuit stop signal 4900 to the faithful simulation execution mechanism 2800, and the faithful simulation execution mechanism 2800 which receives the circuit stop signal 4900 stops the simulation execution (S14).

If the request 4300 for the register values at time "t" is transferred after the simulation execution is stopped (S15: YES), the register value recovery mechanism 2400 identifies the position corresponding to the time "t" in the cycle determined by the cycle start time and the cycle end time, and the register values at the identified position are outputted as the register values 4400 at time "t" (S16). It is possible to, if the request 4300 for the register values specifies particular registers, output only the values of the particular registers and, otherwise, output the values of all the registers. When the request 4300 for the register values at time "t" is not transferred after the simulation execution is stopped (S15: NO), then the processing is ended in accordance with input of an end instruction by the user or the like.

Figure 6:
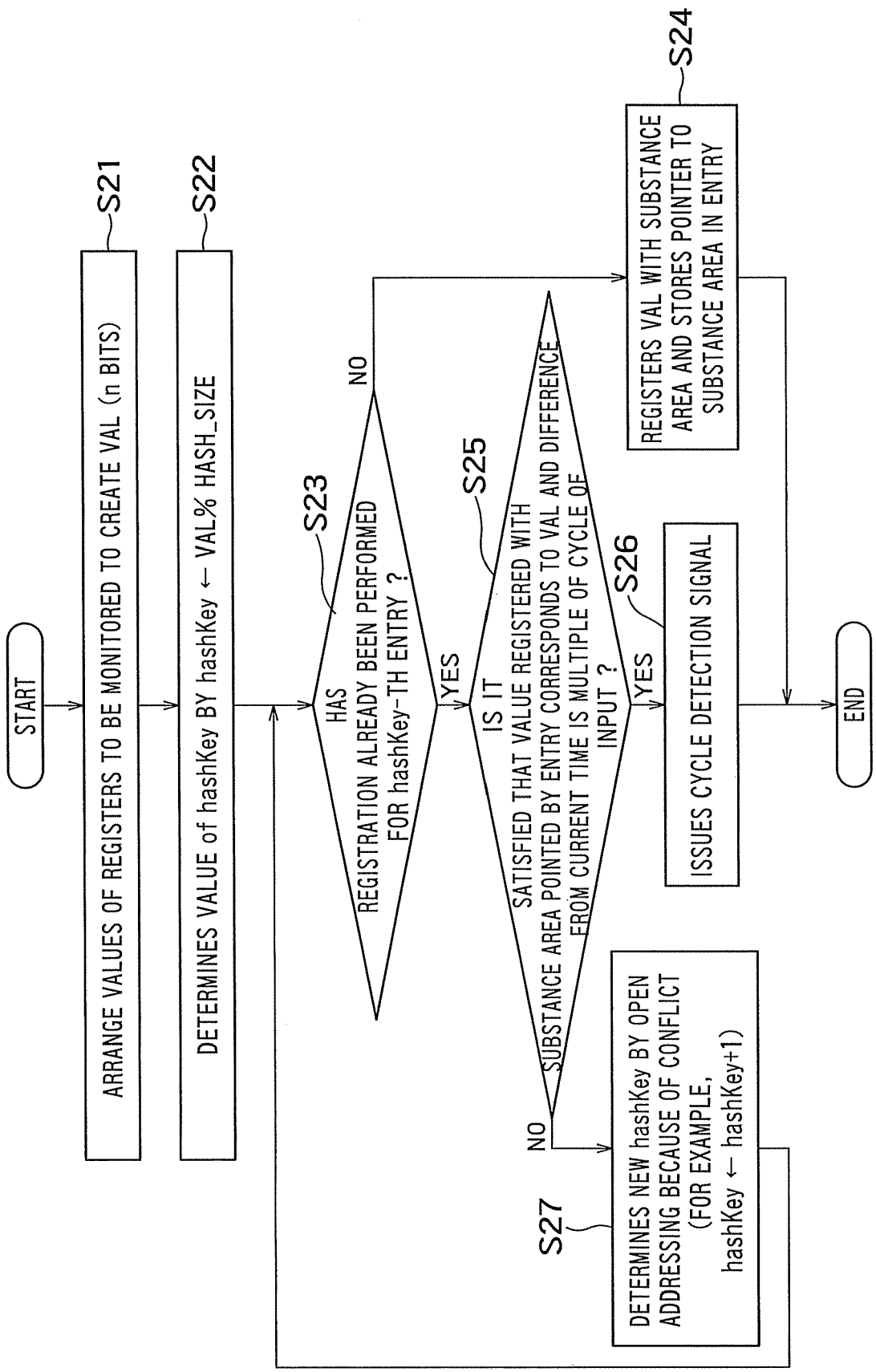
FIG. 6 is a flowchart showing the details of implementation of register value registration processing and cycle detection processing with the use of a hash table.
Figure 7:
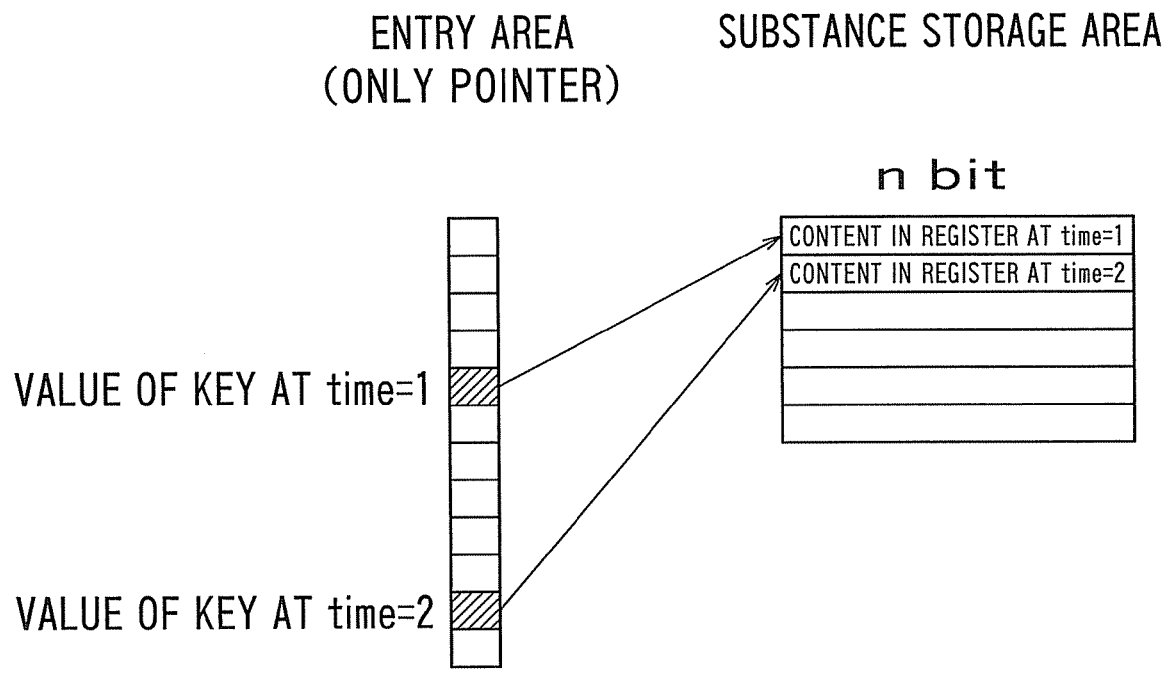
FIG. 7 is a diagram illustrating a register value registration method with the use of a hash table.

As an example of efficiently realizing the processings by the register value monitoring mechanism 2300 and the cyclicity detection mechanism 2500 corresponding to the steps S11 and S12 in the flowchart in FIG. 5, a method using a hash table will be described with reference to the flowchart in FIG. 6. Here, the hash table is assumed to be constituted by an entry area and a substance storage area as shown in FIG. 7. A pointer (assumed to be of 4 bytes) to the substance storage area is stored in the entry area, and register values (assumed to be of n bits" are registered with the substance storage area.

First, a value "VAL" (corresponding to one vertical line in FIG. 10), in which the bits of the registers used for the circuit (the registers in the register value table 4600) are arranged, is created (S21). It is assumed that "VAL" consists of n bits. For example, referring to the first line (time=0) in FIG. 10, the bit width of "cnt" and "cnt_next" is 2 bits, and the bit width of the other registers is 1 bit, and therefore, "VAL" is "1000010010" when indicated by a binary number in which the register values are arranged.

Next, "hashKey" is created based on "VAL" (S22). For example, the remainder obtained by dividing "VAL" by a predetermined hash table size ("HASH_SIZE") is set as the hash key ("hashKey").

Next, it is checked whether or not a pointer is been registered with the hashKey-th entry area (S13). If it is not registered (S23: NO), then "VAL" is registered with an empty substance storage area, and a pointer to the substance storage area is stored in the hashKey-th entry area (S24).

If a pointer is registered with the hashKey-th entry area (S23: YES), then it is checked whether or not the value registered with the substance area pointed at by the pointer is the same as the value of "VAL", and the difference between the current time and the time of the values registered with the substance area is a multiple of the cycle of input (S25). If both of the conditions are satisfied (S25: YES), then the cyclicity detection mechanism 2500 transfers a cycle detection signal 4800 (S26).

If these conditions are not satisfied (S25: NO), it means that a conflict has occurred. Therefore, a new "hashKey" is determined in accordance with open addressing. For example, the new "hashKey" may be determined by adding 1 to the original "hashKey" (S27). Then, the flow returns to step S23.

Description will be made on the details of the processing by the register value recovery mechanism 2400 (step S16 in FIG. 5) in the above-described case of using a hash table, with reference to FIGS. 8 and 9.

At step S16 described above, the requested register values at the time "t" are determined and outputted while the simulation execution is stopped. Here, the cycle start time "Ts" and the cycle end time "Tg" are stored in the past data storage table 4700, and a cycle "C" is derived by Tg−Ts.

When the request 4300 for the register values at time "t" is transferred, "T" satisfying T≡t(modC) and Ts≦T≦Tg (S31) is determined. T≡t(modC) means that the remainder obtained by dividing "T" by "C" equals to the remainder obtained by dividing "t" by "C". Then, the register values at the time "T" are taken out, as shown in FIG. 9 (S32).

Here, description has been made on the method using a hash table as an example of a method for realizing the past data storage table 4700 related to the register value monitoring mechanism 2300 and the register value recovery mechanism 2400. However, as a method for sequentially storing register data (the values of registers) to refer to them at a high speed, other methods such as a method using a tree can also be used. Though an embodiment has been shown in which open addressing is used as a countermeasure for a conflict which may occur in the case of using a hash table, other methods such as chain hashing can be also used.

A specific example of the operation of the simulation execution circuit model 6000 in FIG. 1 will be shown below.

FIG. 10 shows change in the values of the respective registers before detection of cyclicity, which is caused when the logic circuit description (logic circuit model) 1100 in FIG. 3 is executed by the faithful simulation execution mechanism 2800. FIG. 11 shows the register values recovered by the register value recovery mechanism 2400 when a request 4300 for the register values at time 100 is received.

As shown in the flowchart in FIG. 5, the faithful simulation execution mechanism 2800 and the register value monitoring mechanism 2300 operate until cyclicity is detected, and as a result, the values of the registers are stored in the past data storage table 4700 with time as shown in FIG. 10 (S11 of FIG. 5).

Here, because the values of the registers at time=32 completely equal to the values at time=0, and the time difference (32−0=32) is a multiple of the cycle of input (=2), the cyclicity detection mechanism 2500 detects the cyclicity of the values of the registers (register data) (S12 in FIG. 5: YES).

The cyclicity detection mechanism 2500 registers the cycle start time Ts=0 and the cycle end time Tg=32 with the past data storage table 4700 and transfers a cycle detection signal 4800 to the circuit switching mechanism 2700 (S13).

The circuit switching mechanism 2700 transfers a circuit stop signal 5000 to the faithful simulation execution mechanism 2800 at time=32 to stop the simulation execution by the faithful simulation execution mechanism 2800 (S14 in FIG. 5).

Figure 8:
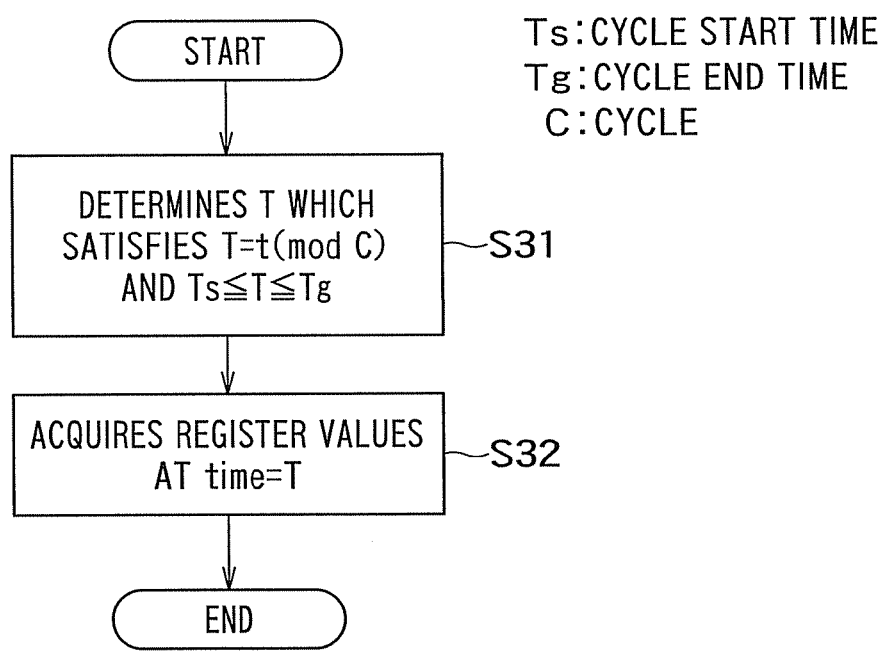
FIG. 8 is a flowchart illustrating the details of implementation of register value recovery processing with the use of a hash table.
Figure 9:
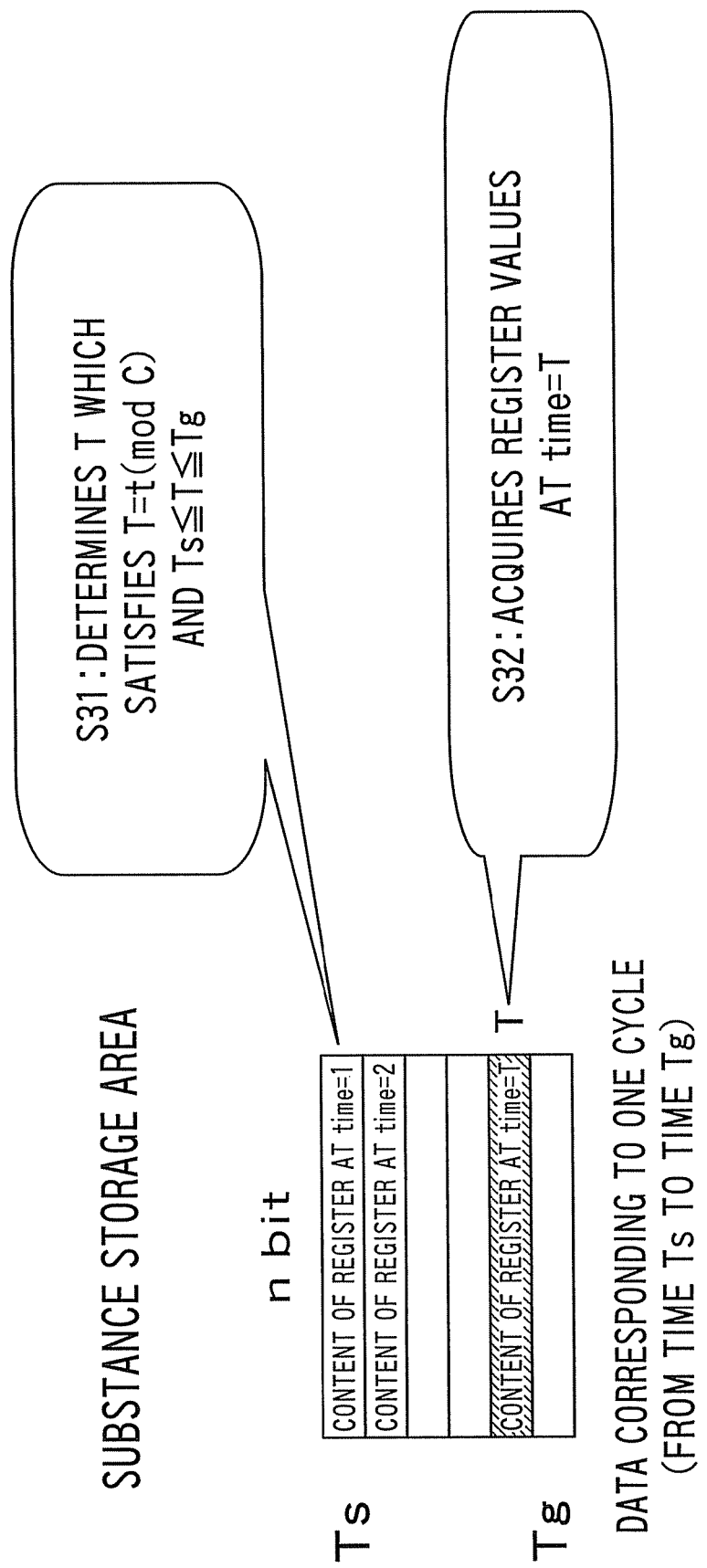
FIG. 9 is a diagram illustrating a method for recovering register values at time "t"

After that, if a request 4300 for the register values at the time 100 is received, the value of "T" is obtained in such a manner as described at step S31 in FIG. 8. In this case, because of time=100, Ts=0, Tg=32 and the cycle C=32, T=4 can be obtained by simple calculation. Therefore, the value in the substance storage area at time=4 is taken out as shown in FIG. 9.

As described above, according to this embodiment, by stopping a faithful simulation execution mechanism if the cyclicity of register values is detected during simulation execution, it is possible to execute simulation at a high speed.

(Second Embodiment)

In this embodiment, description will be made on the case where, though there is not an irregular input signal to a circuit (a timer circuit), an output signal from the circuit is necessary.

Figure 12:
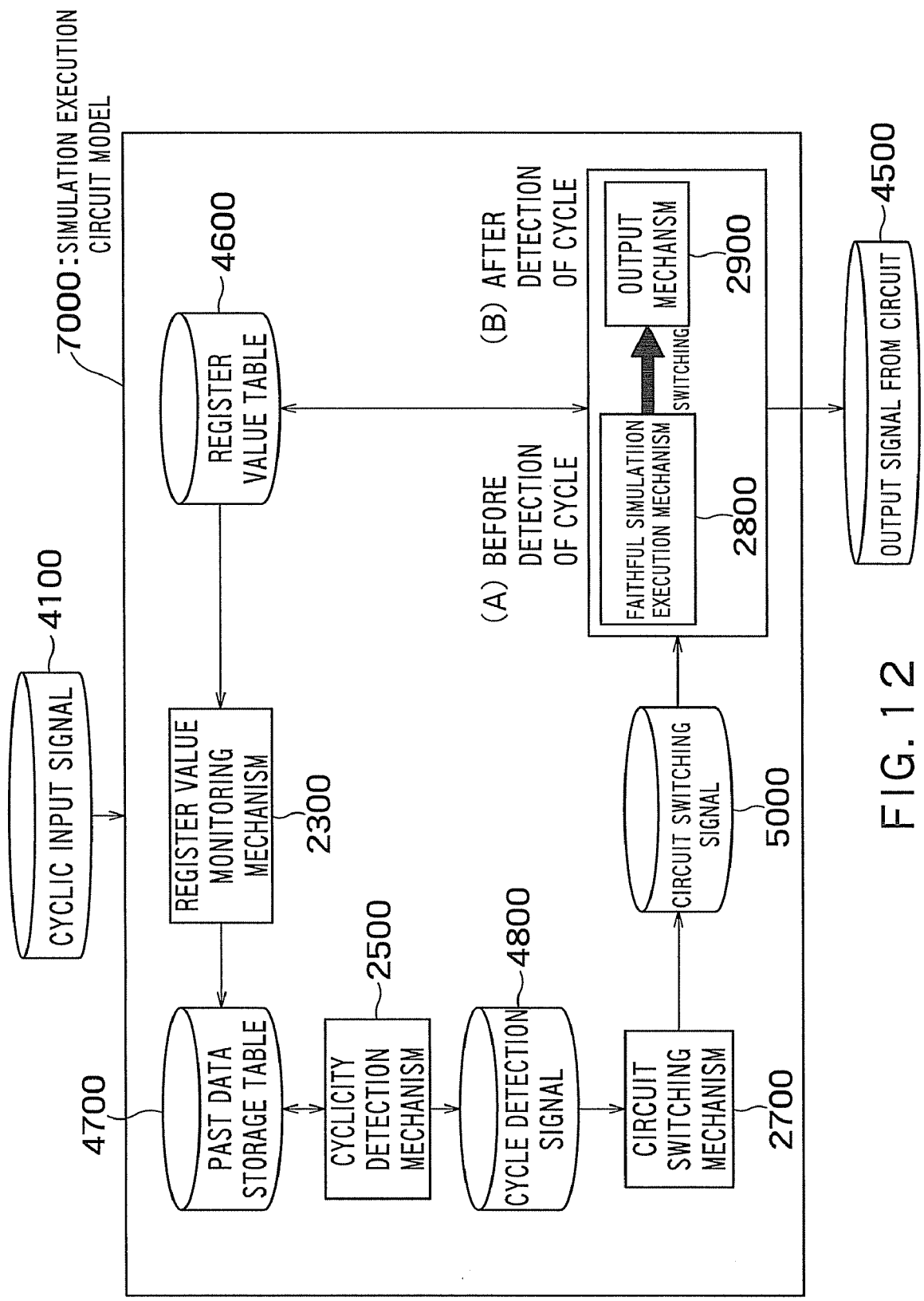
FIG. 12 is a diagram showing the configuration of a simulation execution circuit model according to a second embodiment.

FIG. 12 is a diagram showing the configuration of a simulation execution circuit model (a simulation execution apparatus) 7000 as a second embodiment of the present invention.

Figure 13:
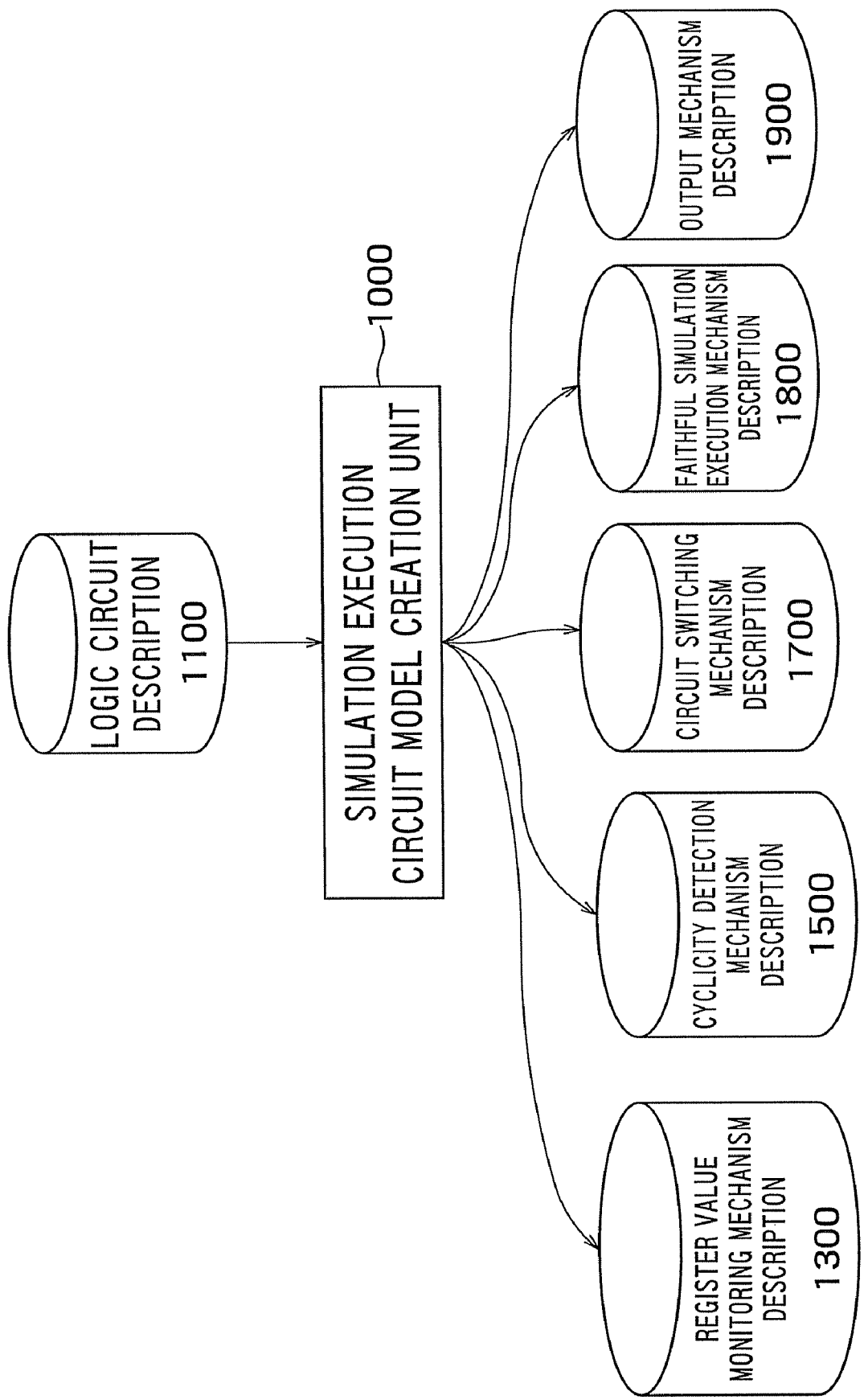
FIG. 13 is a diagram showing an example of a method for automatically creating the simulation execution circuit model in FIG. 12.

The simulation execution circuit model 7000 is provided with a register value monitoring mechanism 2300, a cyclicity detection mechanism 2500, a past data storage table 4700, a circuit switching mechanism 2700, a faithful simulation execution mechanism 2800 and an output mechanism 2900. The simulation execution circuit model 7000 is intended to accurately output an output signal 4500 from the circuit while simulation execution is stopped, with a cyclic input signal 4100 from the outside as input. Similarly to the first embodiment and as shown in FIG. 13, the respective mechanisms are realized by analyzing logic circuit description 1100 and automatically generating descriptions corresponding to the mechanisms (register value monitoring mechanism description 1300, cyclicity detection mechanism description 1500, circuit switching mechanism description 1700, faithful simulation execution mechanism description 1800 and output mechanism description 1900) with a simulation execution circuit model creation unit 1000, and interpreting and executing the descriptions. It is also possible to, by adding a register value recovery mechanism 2400, extend this embodiment so that the register values 4400 at time "t" are outputted when a request 4300 for the register values at time "t" is received, similarly to the simulation execution circuit model 6000 in the first embodiment.

Figure 14:
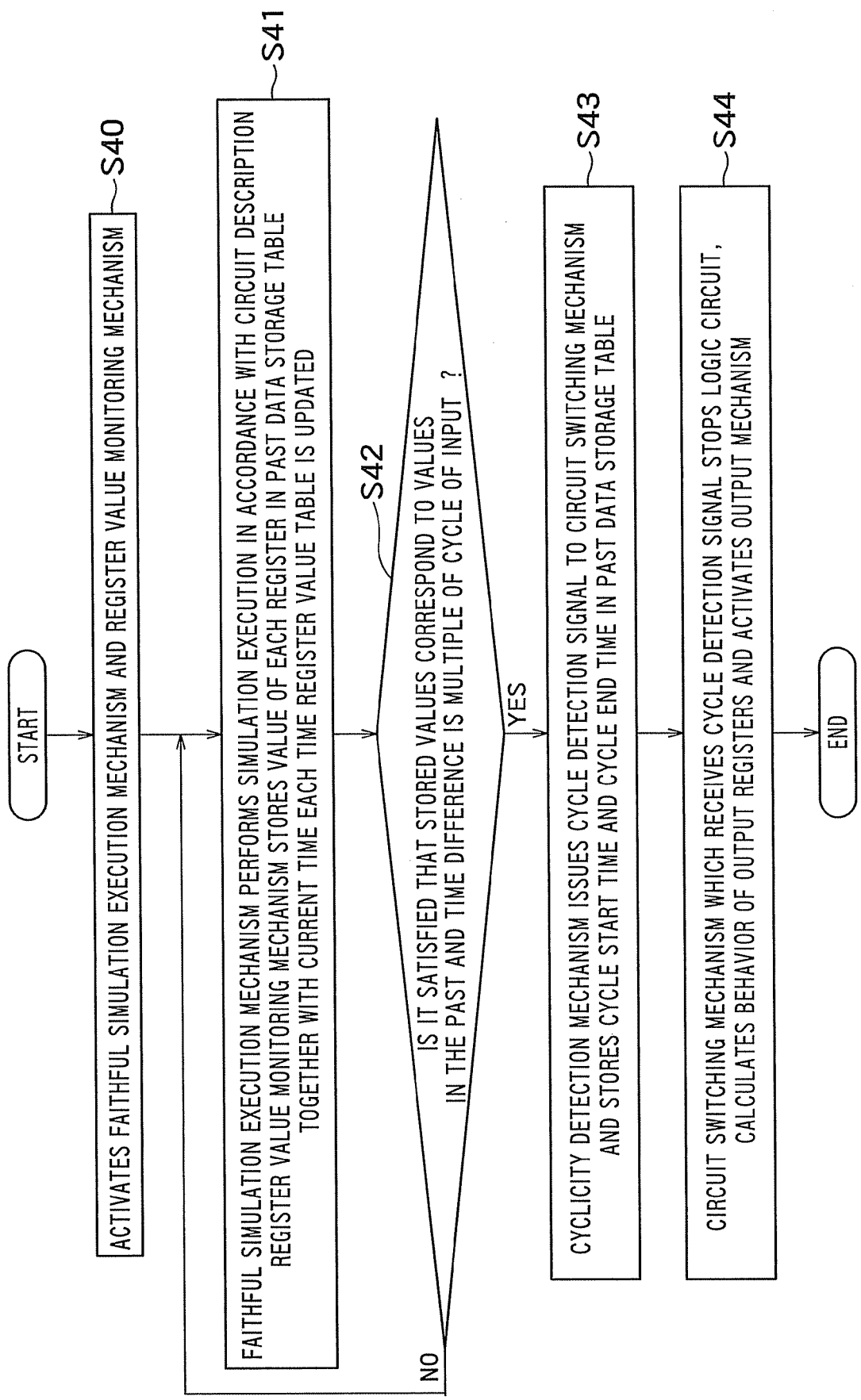
FIG. 14 is a flowchart illustrating the operation performed when simulation execution of the model in FIG. 12 is performed.

FIG. 14 is a flowchart illustrating the operation of the simulation execution circuit model 7000 in FIG. 12.

The difference between the second and first embodiments is only the processing performed by the cyclicity detection mechanism 2500 at the time of detection of cyclicity and subsequent processings. Therefore, description will be made only on step S44, which is the difference, and description on the other steps S40 to S43 will be omitted.

When detecting the cyclicity of the values of the registers (register data), the cyclicity detection mechanism 2500 performs the following processing in addition to the processings described in the first embodiment.

The cyclicity detection mechanism 2500 checks all the movement of the output register during the cycle from the cycle start time "Ts" to the cycle end time "Tg" and creates an output register operation table (to be described later) in which the value of the output register is recorded in a time series.

Receiving a cycle detection signal 4800 from the cyclicity detection mechanism 2500, the circuit switching mechanism 2700 outputs a circuit switching signal 5000 for instructing stop of the simulation execution by the faithful simulation execution mechanism 2800 and activation of the output mechanism 2900, to the faithful simulation execution mechanism 2800. Consequently, the faithful simulation execution mechanism 2800 stops the simulation execution and activates the output mechanism 2900. The activated output mechanism 2900 causes only the value of the output register in the register value table 4600 to change, based on the output register operation table described above and a cyclic input signal 4100 inputted from the outside.

Description will be made on a specific example of the operation of the simulation execution circuit model 7000 in FIG. 12 below.

Now, consideration will be made on the case where output of the value of the output register "output" is necessary in simulation execution of the logic circuit description (logic circuit model) 1100 in FIG. 3. In this case, the processings performed before detection of cyclicity are similar to those in the first embodiment, and the same register values as in FIG. 10 are sequentially stored in the past data storage table 4700.

If the cyclicity detection mechanism 2500 detects cyclicity (it is detected at time=32), processing is performed in accordance with step S44 in FIG. 14.

First, at the time point of detecting the cyclicity, the cyclicity detection mechanism 2500 checks the movement of the output register from the cycle start time to the cycle end time and creates an output register operation table in which the check result is recorded. In the example of the simulation execution of the logic circuit description 1100 in FIG. 3, the values of the output register "output" every two times during the period from time 0 to time 32 corresponding to a cycle are {0,0,0,0,0,0,0,0,0,0,1,1,1,1,0,0} as shown in FIG. 10. Therefore, the time of continuation of a value and the value are combined as a set, and information such as {{20,0},{8,1},{4,0}} is stored as the output register operation table.

When receiving a cycle detection signal 4800 from the cyclicity detection mechanism 2500, the circuit switching mechanism 2700 transfers a circuit switching signal 5000. As a result, the faithful simulation execution mechanism 2800 stops, and the output mechanism 2900 is activated.

By using the output register operation table to repeatedly perform processing corresponding to the code in a Verilog HDL like language shown in FIG. 15, the output mechanism 2900 updates the value of the output register in the register value table 4600. Even while simulation execution is stopped, it is possible to acquire an accurate value of the output register by referring to the output register in the register value table 4600.

As described above, according to this embodiment, even when output from the circuit is necessary, it is possible to execute simulation at a high speed because it is only necessary to perform light processing for causing the output register value to change based on cyclicity after the faithful simulation execution mechanism is stopped.

(Third Embodiment)

In this embodiment, description will be made on the case where an output signal from the circuit (the timer circuit) is necessary, and there may be an irregular input signal (for example, a RESET signal) to the circuit.

Figure 16:
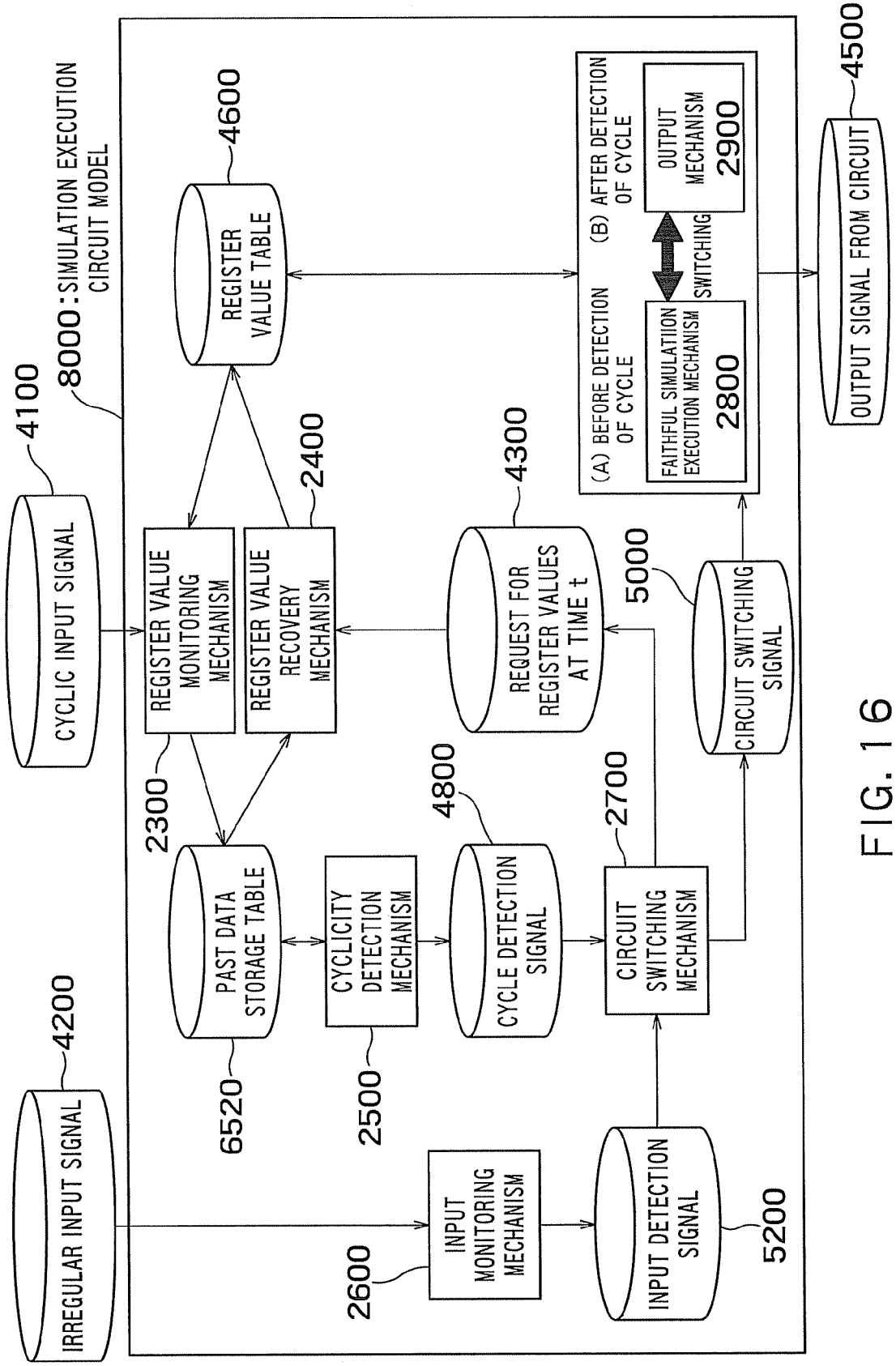
FIG. 16 is a diagram showing the configuration of a simulation execution circuit model according to a third embodiment.

FIG. 16 is a diagram showing the configuration of a simulation execution circuit model (simulation execution apparatus) 8000 as a third embodiment of the present invention.

This simulation execution circuit model 8000 is provided with a register value monitoring mechanism 2300, a register value recovery mechanism 2400, a cyclicity detection mechanism 2500, an input monitoring mechanism (input detection mechanism) 2600, a circuit switching mechanism 2700, a faithful simulation execution mechanism 2800, an output mechanism 2900, a register value table 4600 and a past data storage table 6520.

Figure 17:
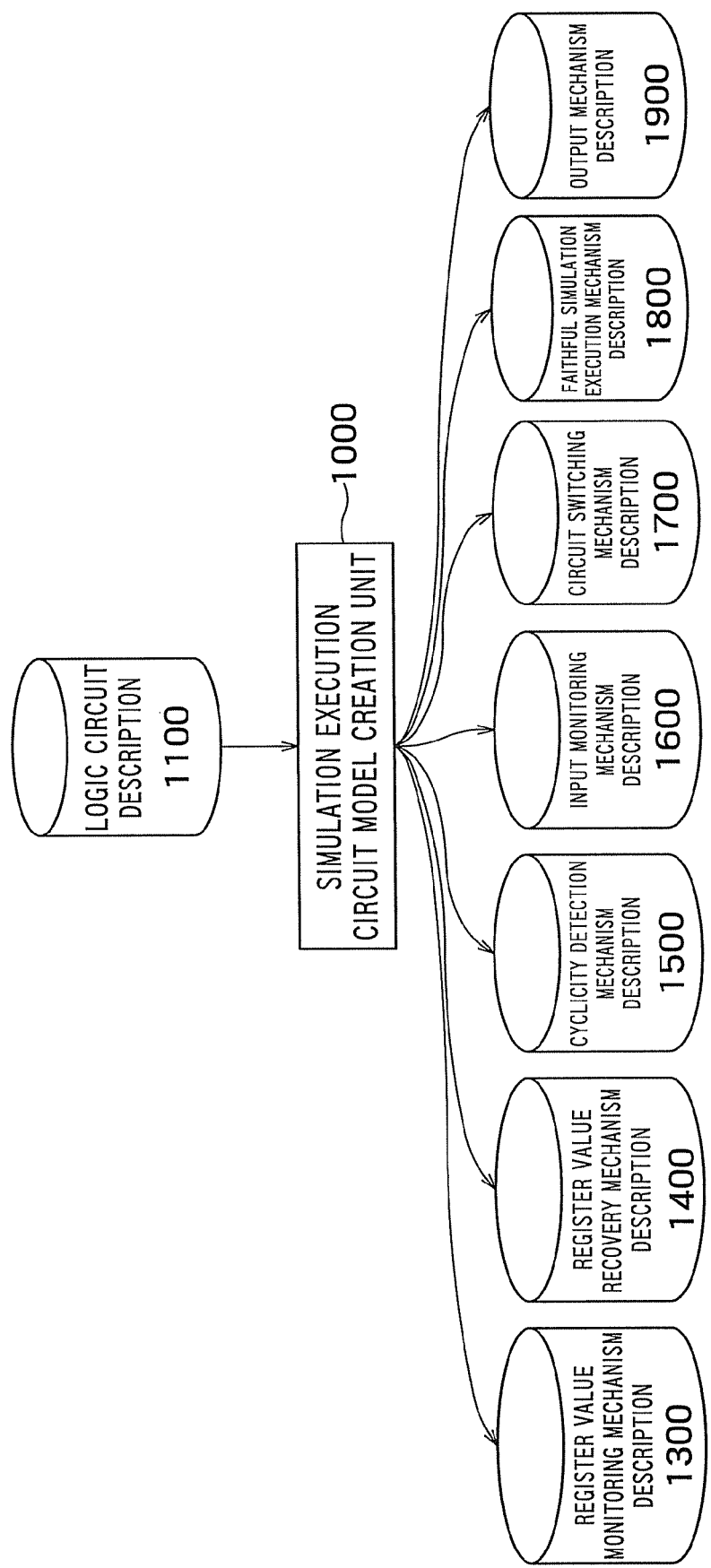
FIG. 17 is a diagram showing an example of a method for automatically creating the simulation execution circuit model in FIG. 16.

This simulation execution circuit model 8000 is intended to accurately output an output signal 4500 to be outputted from the circuit to an external circuit even when there is an irregular input signal 4200 during stop of simulation execution. The external circuit is, for example, a circuit the simulation execution of which is being performed outside the simulation execution circuit model 8000. The input monitoring mechanism 2600 detects the irregular input signal 4200 during stop of simulation execution and transfers an input detection signal 5200 to the circuit switching mechanism 2700. Similarly to the first and second embodiments and as shown in FIG. 17, the respective mechanisms are realized by analyzing the logic circuit description 1100 and automatically generating descriptions corresponding to the mechanisms (register value monitoring mechanism description 1300, cyclicity detection mechanism description 1500, input monitoring mechanism description 1600, circuit switching mechanism description 1700, faithful simulation execution mechanism description 1800 and output mechanism description 1900) with a simulation execution circuit model creation unit 1000, and interpreting and executing the descriptions.

Figure 18:
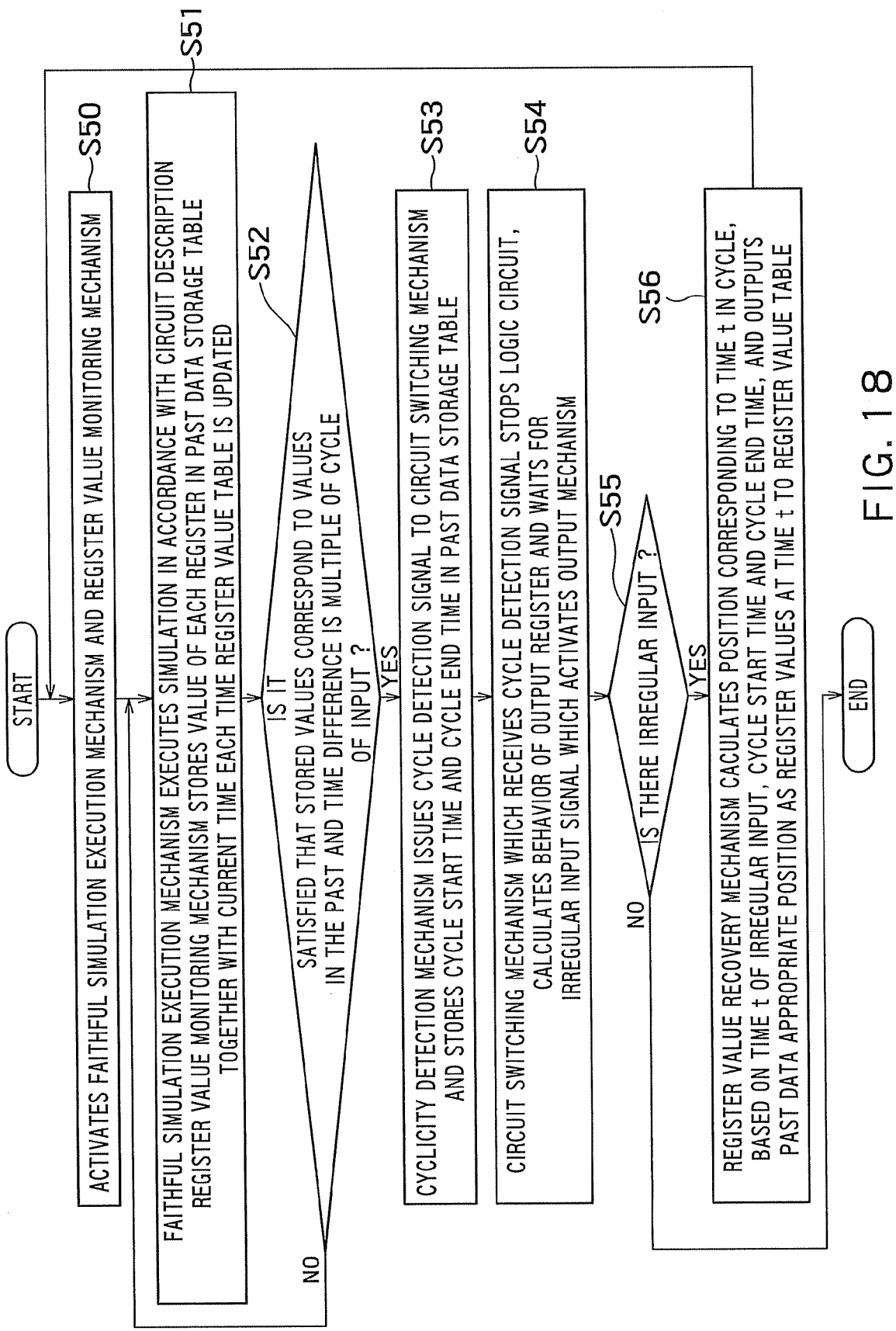
FIG. 18 is a flowchart illustrating the operation performed when simulation execution of the model in FIG. 16 is performed.

FIG. 18 is a flowchart illustrating the processing for accurately outputting an output signal 4500 which is to be outputted from a circuit corresponding to the logic circuit description 1100.

In this embodiment, the processings by the circuit switching mechanism 2700 and the register value recovery mechanism 2400 are different in comparison with the second embodiment. This is because, if an irregular input signal 4200 is inputted to the circuit, the preconditions for the cyclic operation are unsatisfied, and it is necessary to return to the operation of the faithful simulation execution mechanism 2800.

The processings performed before an irregular input signal 4200 is detected (S50 to S54) are similar to those in the second embodiment, detailed description thereof will be omitted.

If the input monitoring mechanism 2600 detects an irregular input signal 4200 while the faithful simulation execution mechanism 2800 is stopped (S55: YES), an input detection signal 5200 is transferred to the circuit switching mechanism 2700. Receiving the input detection signal 5200, the circuit switching mechanism 2700 first sends a request 4300 for the register values at time "t" to the register value recovery mechanism 2400, where "t" is the time when the irregular input signal 4200 is detected. Receiving the request 4300 for the register values at time "t", the register value recovery mechanism 2400 writes the register values corresponding to the time "t" stored in the past data storage table 4700 in the register value table 4600 (S56). Change in the value of a register (for example, "RESET") due to the irregular input signal 4200 is also written in the register value table 4600 (S56). After that, the circuit switching mechanism 2700 sends a circuit switching signal 5000 to the output mechanism 2900 and the faithful simulation execution mechanism 2800. As a result, the operation of the output mechanism 2900 stops, and the operation of the faithful simulation execution mechanism 2800 resumes. By the series of processings, the operation of the faithful simulation execution mechanism 2800 can be started again at the point of time when the irregular input signal 4200 is detected.

A specific example of the operation of the simulation execution circuit model 8000 in FIG. 16 will be described below.

Now, consideration will be made on the case where, while simulation execution of the logic circuit description 1100 in FIG. 3 is stopped, an irregular input signal 4200 indicating "RESET<-1" (1 is to be inputted to the RESET register) at time=100 is detected.

First, the input monitoring mechanism 2600 transfers an input detection signal 5200 to the circuit switching mechanism 2700. The circuit switching mechanism 2700 sends a request 4300 for the register values at time 100, to the register value recovery mechanism 2400. The register value recovery mechanism 2400 acquires the register values at t=100 and writes them in the register value table 4600. The processings performed so far are the same as those in the first embodiment. Additionally, in this embodiment, the value of the RESET register in the register value table 4600 is changed to 1 based on "RESET<-1". By resuming the operation of the faithful simulation execution mechanism 2800 after that, the operation can be accurately continued.

Description has been made on the case where an irregular input signal 4200 is inputted while simulation execution is stopped. If an irregular input signal 4200 is inputted while simulation execution is performed, the following is performed, for example. When detecting the irregular input signal 4200, the input monitoring mechanism 2600 notifies it to the register value recovery mechanism 2400. Receiving this notification, the register value recovery mechanism 2400 clears the past data storage table 6520 (because the preconditions for the cyclic operation are unsatisfied) and writes a value (1) based on the irregular input signal 4200 in a register in the register value table 4600 (for example, the RESET register.

As described above, according to this embodiment, it is possible to stop circuit operations other than processing for output from the circuit after the cyclicity of register values is detected, and, when an irregular input signal is inputted, the register values are recovered based on stored register values to resume normal circuit operation. Thereby, it is possible to execute simulation at a high speed without an error.

(Fourth Embodiment)

In the fourth and fifth embodiments, methods improved from the first to third embodiments will be described. In the fourth and fifth embodiments, the processings after detection of cyclicity during simulation execution are almost the same as those in the first to third embodiments. Therefore, in the fourth and fifth embodiments, description will be made mainly on difference from the processings before detection of cyclicity during simulation execution in the third embodiment, as an example.

Figure 19:
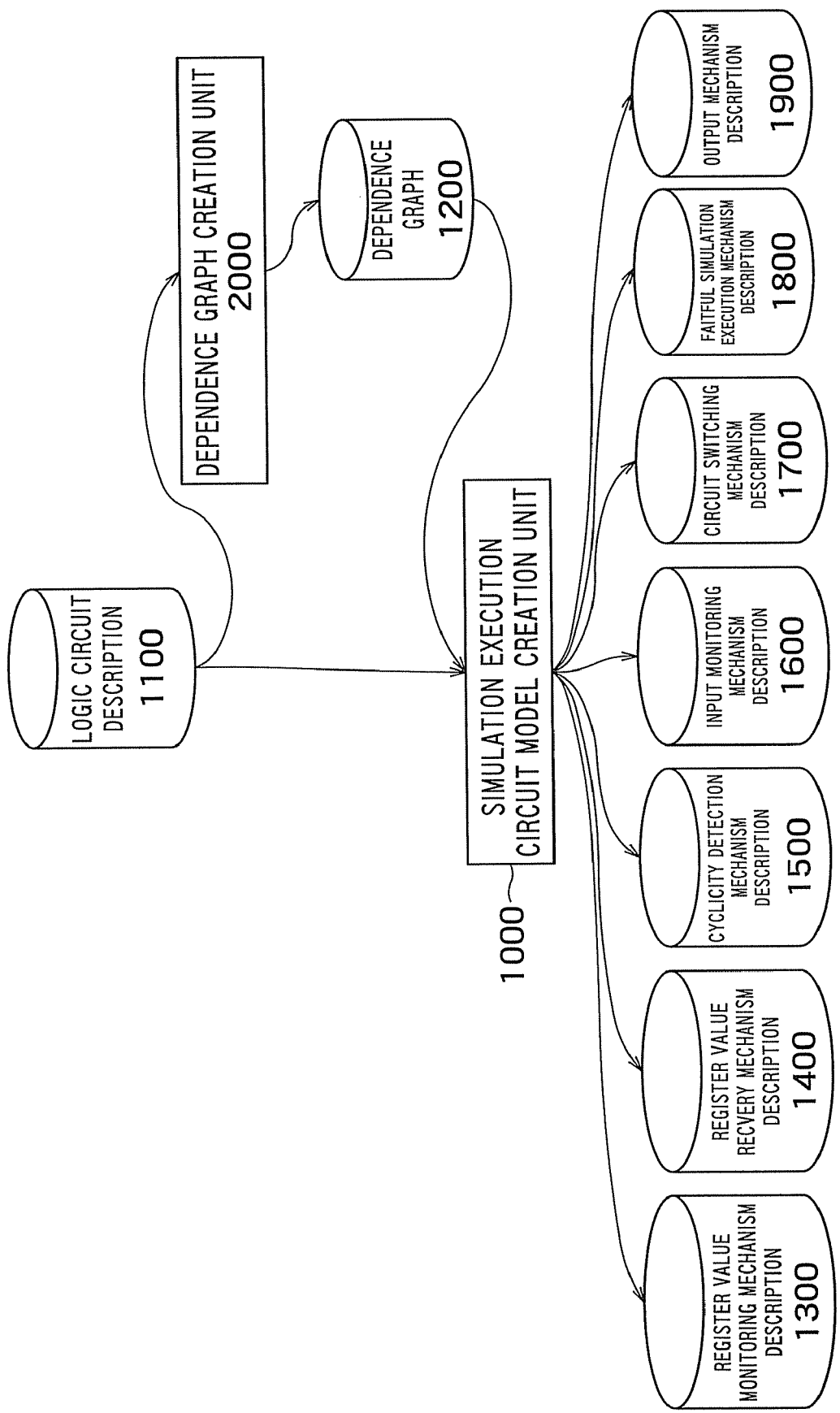
FIG. 19 is a diagram showing a dependence graph creation unit.

In the fourth and fifth embodiments, a dependence graph creation unit 2000 is added to a simulation execution circuit model creation apparatus, and the dependence graph creation unit 2000 creates an inter-register dependence graph 1200 from logic circuit description 1100, as shown in FIG. 19.

Figure 21:
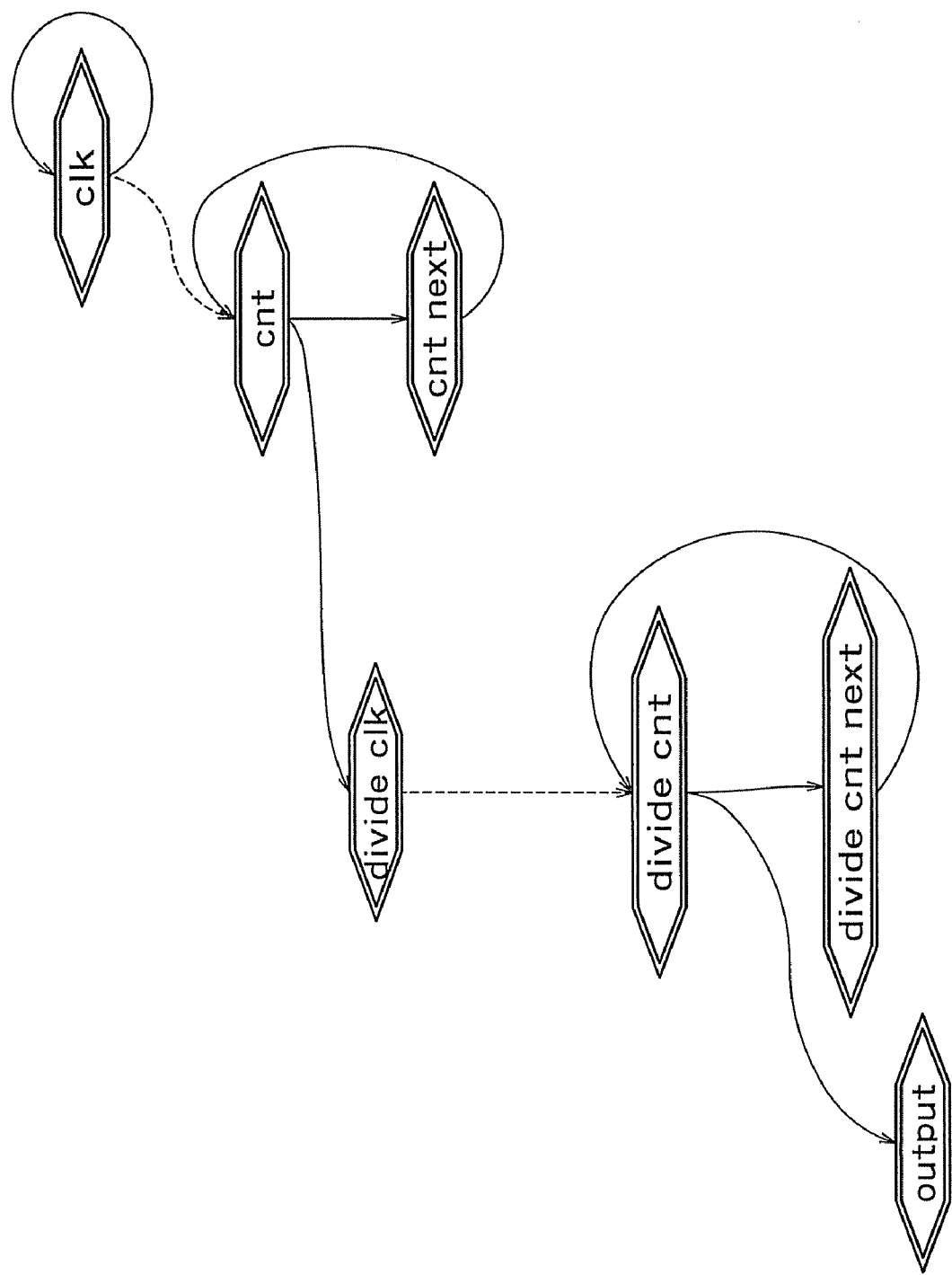
FIG. 21 is a diagram showing an example the dependence graph.

The inter-register dependence graph 1200 is a directed graph, in which nodes correspond to registers, and an arc (a directed arc from a node A to a node B indicates that the value of the node A is used for calculation of the value of the node B. FIG. 21 shows an example of the inter-register dependence graph 1200 created for the logic circuit description 1100 in FIG. 3.

Figure 20:
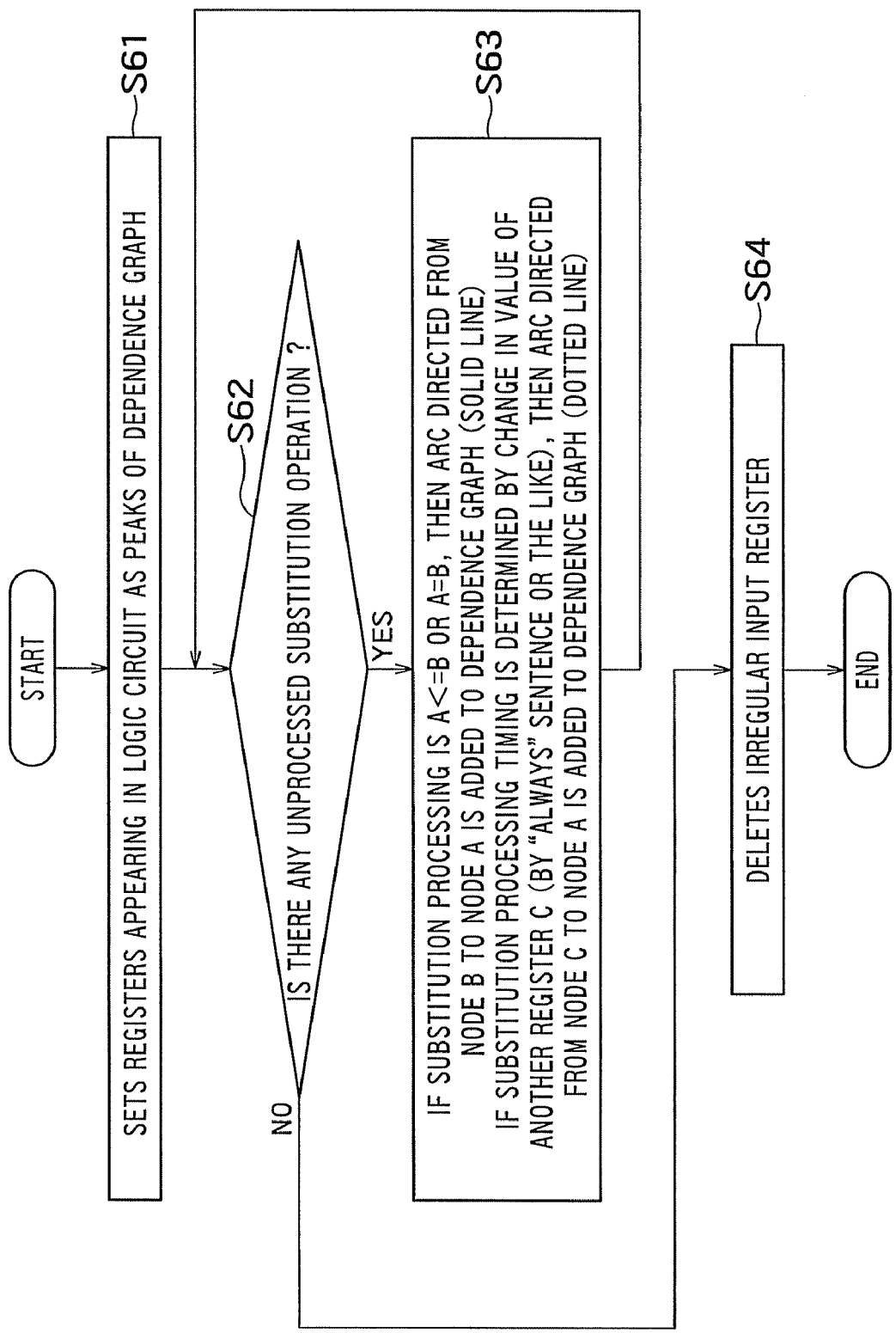
FIG. 20 is a flowchart illustrating dependence graph creation processing.

FIG. 20 is a flowchart illustrating the outline of processing for creating the inter-register dependence graph 1200 performed when the logic circuit description 1100 is written in Verilog HDL. Similar processing can be performed for logic circuit description 1100 other than the logic circuit description 1100 in Verilog HDL.

First, registers appearing in the logic circuit description 1100 are set as the nodes of the inter-register dependence graph 1200 (S61).

Next, if there is any substitution processing (an expression including A<=B or A=B) in the logic circuit description 1100 (S62: YES), then a solid-line arc (a directed arc) which is directed from the node B (a second register) to the node A (a first register) is added to the inter-register dependence graph 1200 (S63). The dependence graph creation unit 2000 has a register detection unit for detecting the first register. If the timing of the substitution processing is determined by the value (including change in the value) of another register C (a third register), a dotted-line arc (a directed arc) directed from the node C to the node A is added to the inter-register dependence graph 1200 (S63).

Last, nodes and arcs corresponding to registers which store a value based on an irregular input signal (irregular input registers) are deleted (S64).

In the fourth and fifth embodiments, the inter-register dependence graph 1200 created as described above is used to improve the efficiency of the processings before detection the cyclicity of the whole circuit. This embodiment will be described in detail below.

Figure 22:
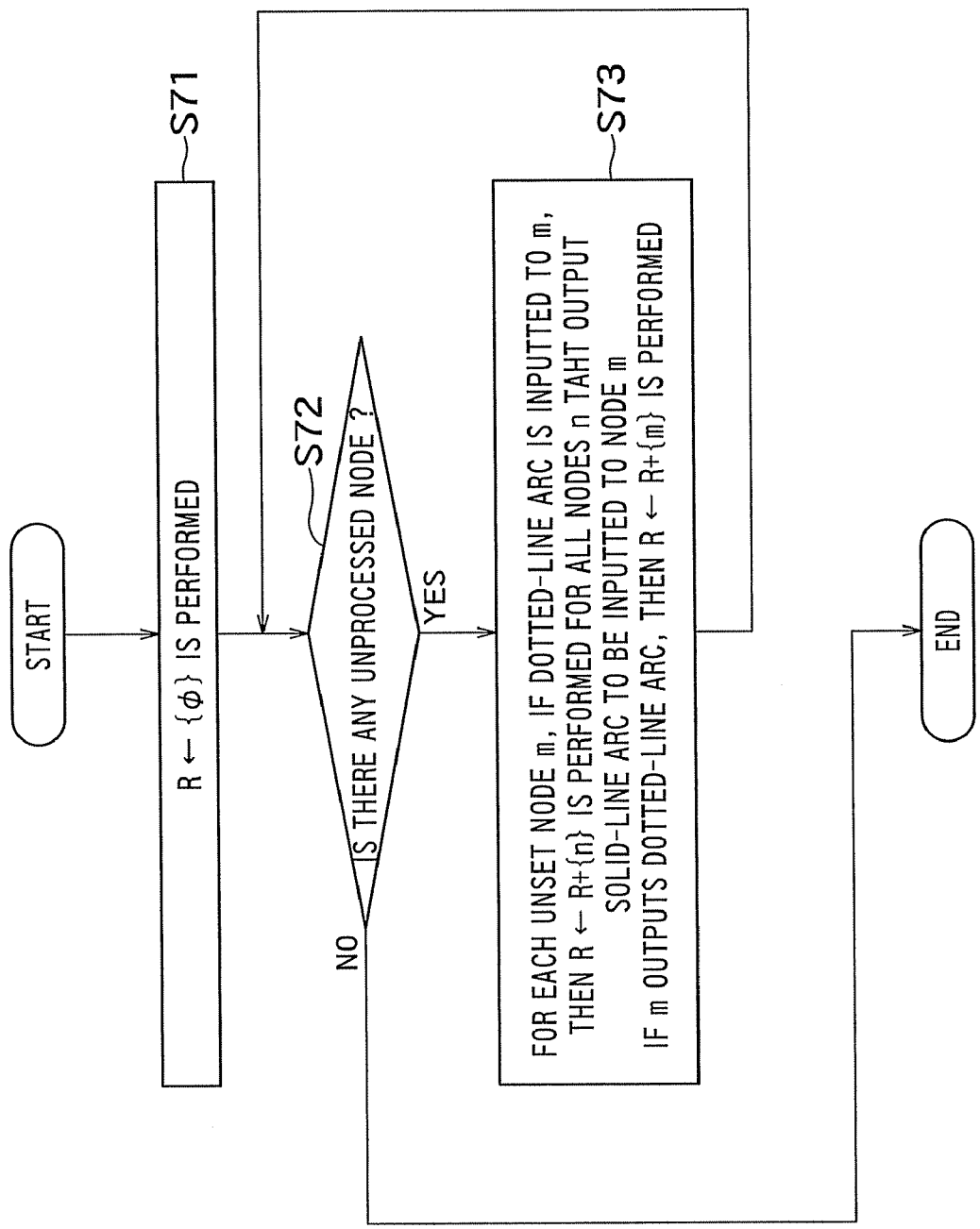
FIG. 22 is a flowchart showing processing for limiting registers to be monitored.

FIG. 22 is a flowchart illustrating an example of monitoring a part of registers (a method for limiting a set of registers to be monitored "R") related according to the fourth embodiment.

First, R<–{φ} is performed (S71). That is, "R" begins as an empty set.

Then, processing is performed sequentially for each of unprocessed nodes (S72).

If a dotted-line arc is inputted to a node "m" to be targeted, and there is a solid-line arc to be inputted to the node "m", R<–R+{n} is performed for a node "n" which outputs the solid line (S73). That is, the node "n" is added to the set of registers to be monitored "R". If the node "m" outputs a dotted line, R<–R+{m} is performed (S73). That is, the node "m" is added to the set of registers to be monitored "R". The set of registers to be monitored "R" can be obtained by performing this processing for all the nodes. Thus, when a register the value of which can be calculated from another register (the second register, the third register or both of the registers) is assumed to be the first register, that other register is stored in the set of registers to be monitored "R".

The simulation execution method of this embodiment is quite the same as the third embodiment except that the registers to be monitored and registered by the register value monitoring mechanism 2300 and recovered by the register value recovery mechanism 2400 are not all the registers but limited to the set of register to be monitored "R". According to this method, it is possible to reduce the cost for the register value monitoring mechanism 2300 and the register value recovery mechanism 2400 to perform processing once. The values of the registers which are not included in the set of register to be monitored "R" can be calculated from the values of the registers included in the set of register to be monitored "R" at the identical time, or at the identical time and before or after the time.

A specific example of this embodiment will be described below with the logic circuit description 1100 in FIG. 3 as an example.

Figure 23:
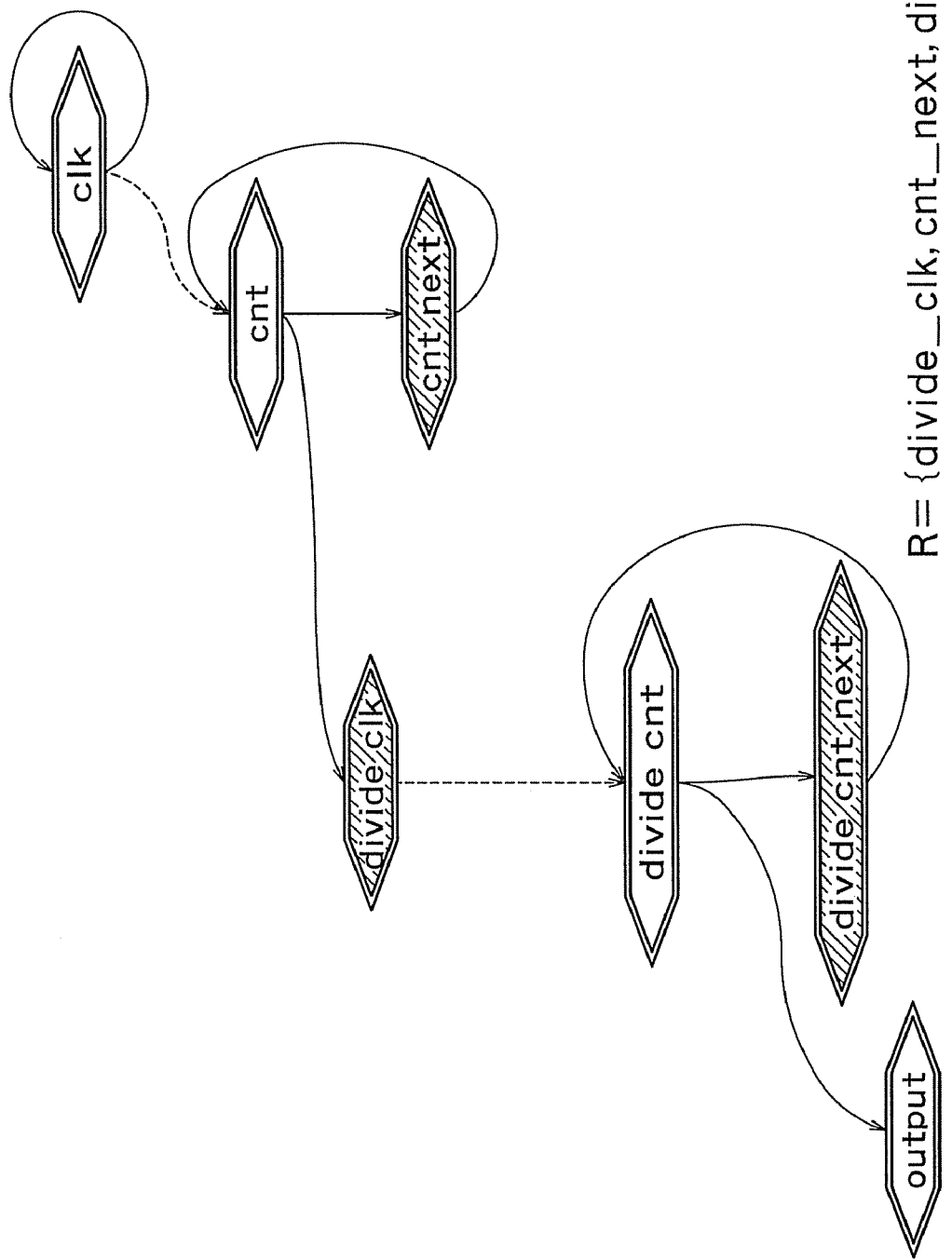
FIG. 23 is a diagram showing an example of registers to be monitored.

First, because a RESET register is a register which stores a value based on an irregular input signal 4200 (an irregular input register), the RESET register is deleted, and the inter-register dependence graph 1200 in FIG. 23 is obtained.

In this inter-register dependence graph 1200, for example, a dotted-line arc is inputted to a "cnt" node, and a solid-line arc is also inputted from a "cnt_next" node. Therefore, "cnt_next" is added to "R". For the same reason, "divide_cnt_next" is also added to "R".

Because a dotted-line arc is outputted from "divide_clk", "divide_clk" is added to "R".

Thus, the set of register to be monitored R={cnt_next, divide_cnt_next, divide_clk} is obtained in the end.

Next, an example of simulation execution in this embodiment will be described with reference to FIG. 24. In the simulation execution of this embodiment, it is only "cnt_next", "divide_clk" and "divide_cnt_next" that have to be monitored, as described above. At time=32, the values of the three registers "cnt_next", "divide_clk" and "divide_cnt_next" completely equal to the values at time=0, and therefore, cyclicity (cycle=32) is detected.

In this case, if a request 4300 for the register values at time "t" is received like in the first embodiment, the register value recovery mechanism 2400 acquires the values of the registers to be monitored, corresponding to the time "t", from the past data storage table 6520. Then, the register value recovery mechanism 2400 determines the values of the registers which are not to be monitored, from the acquired register values and outputs the register values as the register values 4400 at the time "t". The register value recovery mechanism 2400 has a request signal receiving unit, a register value calculation unit and an output unit. For example, if receiving a request for the value of "divide_cnt" at time 6, the register value recovery mechanism 2400 refers to "assign divide_cnt_next=divide_cnt+1" in FIG. 3(B) and returns 1 obtained by subtracting 1 from 2, which is the value of "divide_cnt_next" at the time 6, as the value of "divide_cnt" at the time 6. There may be a case where not only the required register values at the time "t" but also the values of the registers which are not to be monitored are also determined with the use of the register values before or after the time "t" as necessary.

As described above, according to this embodiment, by limiting registers to be monitored, it is possible to reduce overhead caused by monitoring performed until detection of cyclicity and shorten simulation execution time.

(Fifth Embodiment)

In this embodiment, description will be made on an improved method in which monitoring and registration are performed for each of strongly connected components of the inter-register dependence graph 1200.

Figure 26:
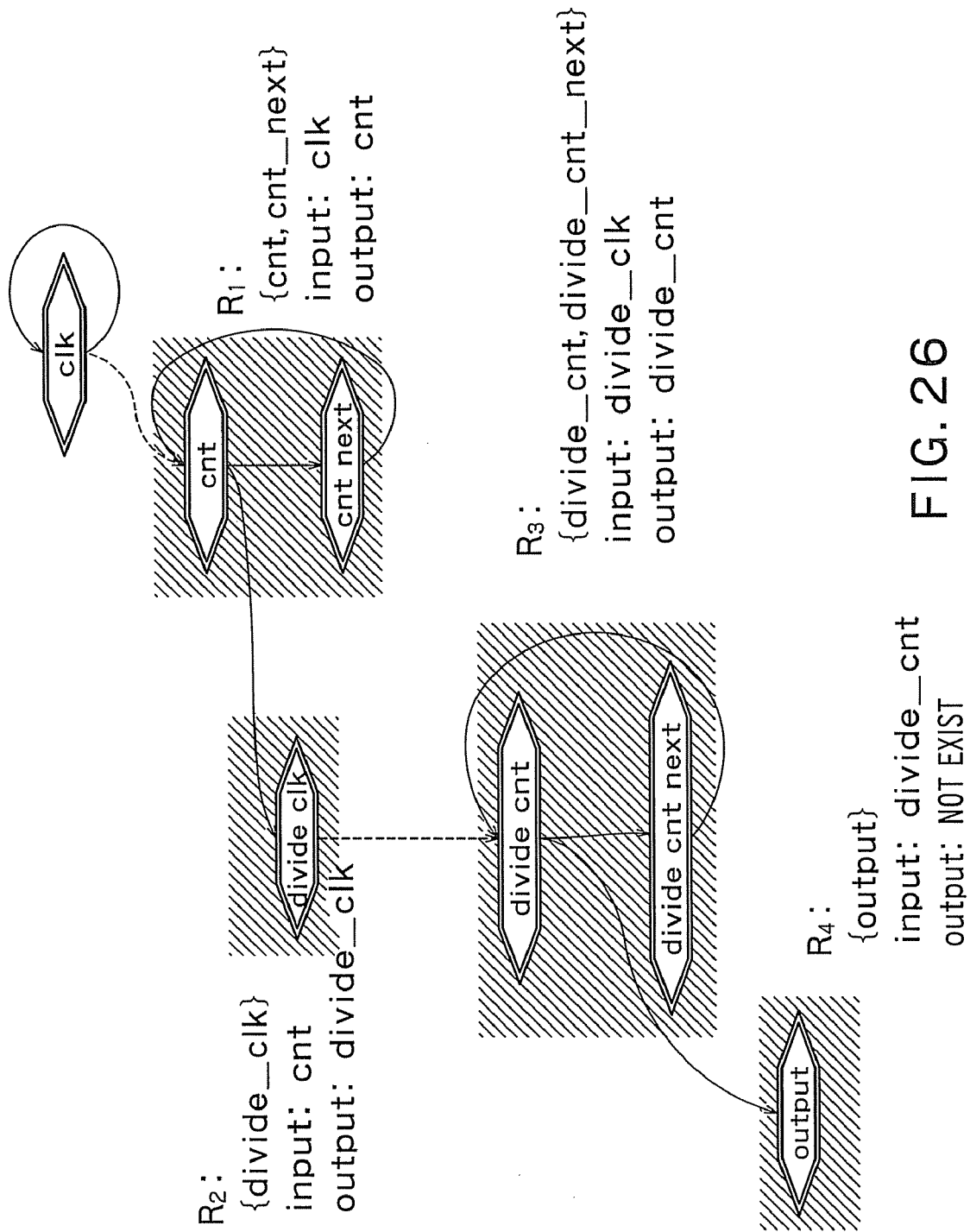
FIG. 26 is a diagram showing an example of strongly connected components.

FIG. 26 is a diagram illustrating the strongly connected components of the inter-register dependence graph 1200.

The inter-register dependence graph 1200 is a directed graph as described above. That a directed graph is a strongly connected one means that there are directed paths in both directions (a loop) between any two nodes on the graph. Any directed graph can be resolved into strongly connected partial graphs. Each of the resolved partial graphs is referred to as a strongly connected component. Tarjan algorithm is known as an algorithm for resolving a directed graph into strongly connected components. The computational complexity is derived by O(m+n), where "n" denotes the number of nodes of the graph, and "m" denotes the number of arcs.

In the example in FIG. 26, the inter-register dependence graph 1200 is resolved into four strongly connected components: $R_1$={cnt, cnt_next}, $R_2$={divide_clk}, $R_3$={divide_cnt, divide_cnt_next} and $R_4$={output}. The input registers for the strongly connected components are $R_1$:{clk}, $R_2$:{cnt}, $R_3$:{divide_clk} and $R_4$:{divide_cnt}, respectively, and the output registers are $R_1$:{cnt}, $R_2$:{divide_clk}, $R_3$:{divide_cnt} and $R_4$:{none}.

The operation of this embodiment will be described below with reference to the flowchart in FIG. 25. Since the difference between the operation of this embodiment and the operation of the third embodiment is the part corresponding to steps S52 to S54 in FIG. 18 used in the third embodiment, only the changed part corresponding to steps S52 to S54 is shown in the flowchart in FIG. 25.

When simulation execution is started, all the registers are monitored the same as in the third embodiment. In this case, the monitoring and registration with the past data storage table 4700 are performed for each of the strongly connected components which are not stopped (S81). As for the timing of the monitoring and the registration, they are performed each time values in the strongly connected component change or for each cycle of a cyclic input signal 4100.

It is checked whether or not the register values in the strongly connected component correspond to register values in the past, and the time required until they correspond is a multiple of the change cycle of all the input registers in each strongly connected component (a cyclic detection condition) (S82). That is, it is necessary that the cycles of the input registers are known in advance. If the change cycles of a part of the input registers in each strongly connected component are unknown, this condition is not satisfied.

If the above described cyclicity detection condition is satisfied (S82: YES), then the cyclicity detection mechanism 2500 transfers a cycle detection signal 4800 related to the strongly connected component for which cyclicity has been detected, to the circuit switching mechanism 2700, and stores cycle start time "Ts" and cycle end time "Tg" in the past data storage table 4700 (S83).

Receiving the cycle detection signal 4800, the circuit switching mechanism 2700 stops such processings as handle the registers included in the strongly connected component for which cyclicity has been detected, among the processings the simulation execution of which is being performed by the faithful simulation execution mechanism 2800, and activates an output mechanism which calculates the behavior of output registers in the strongly connected component (indicating registers which store values to be inputted to the next-stage strongly connected component, in this case) (S84).

It is checked whether or not the processings corresponding to all the strongly connected components have been stopped (S85). If not, the flow returns to step S81. If they have been stopped (S85: YES), then the flow proceeds to step S55 in FIG. 18.

According to the above method, it is possible to gradually stop the respective parts which cyclically operate in the circuit. Furthermore, it is possible to stop only the parts which cyclically operate even if the whole circuit is not cyclically operating.

A specific example of the operation of this embodiment will be described below with simulation execution of the logic circuit description 1100 in FIG. 3 as an example.

First, the inter-register dependence graph 1200 is resolved into the four strongly connected components of $R_1$={cnt, cnt_next}, $R_2$={divide_clk}, $R_3$={divide_cnt, divide_cnt_next} and $R_4$={output} as shown in FIG. 26. The input registers for the strongly connected component are $R_1$:{clk}, $R_2$:{cnt}, $R_3$:{divide_clk}, $R_4$:{divide_cnt}, respectively, and the output registers are $R_1$:{cnt}, $R_2$:{divide_cnt}, $R_3$:{divide_cnt} and $R_4$:{none}, respectively.

Figure 25:
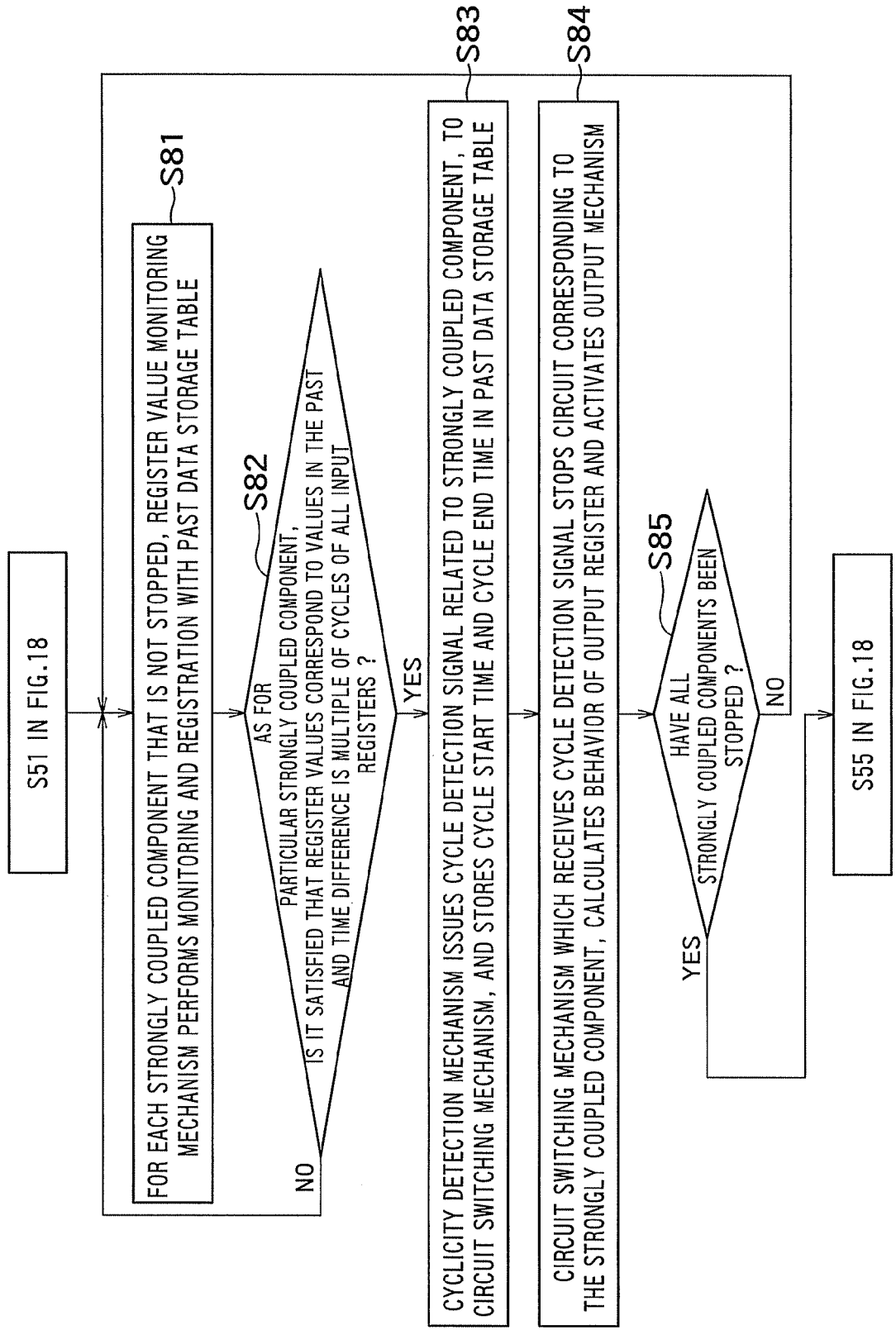
FIG. 25 is a flowchart illustrating the operation of a fifth embodiment.

The simulation execution before detection of cyclicity is performed in accordance with the above-described flowchart in FIG. 25. Specifically, it is performed as shown below.

First, the faithful simulation execution mechanism 2800 performs simulation execution in accordance with the logic circuit description 1100. Then, the register value monitoring mechanism 2300 monitors the register values in a register value table 4600 for each of the strongly connected components $R_1$, $R_2$, $R_3$ and $R_4$ (S81). If a strongly connected component for which the register values have been updated is detected, the register values in the register value table 4600 are stored in the past data storage mechanism 4700 together with the current time (S81). The cyclicity detection mechanism 2500 performs cycle detection processing for each strongly connected component (S82).

In this example, at time=8, the values of the registers "cnt" and "cnt_next" of the strongly connected component $R_1$ correspond to the values at time=0, and the cycle of the strongly connected component $R_1$ (=8) is a multiple of the cycle of the clk register (=2), which is an input register, as shown in FIG. 27. Therefore, 8 is detected as the cycle of the strongly connected component $R_1$ (S83). In this example, as for the timing of the monitoring and the registration, they are performed for each cycle of a cyclic input signal 4100. When 8 is detected as the cycle of the strongly connected component $R_1$, the circuit switching mechanism 2700 stops all the substitution operation processings related to the "cnt" and "cnt_next" registers and activates the output mechanism of the "cnt" register which is an output register (S84). Utilizing that the cycle of the "cnt" register is 8, the cycle of the strongly connected component $R_2$ can be detected at the same point of time=8. This is because the value of the "divide_clk" register at time 8 constituting the strongly connected component $R_2$ equal to the value at time 0, and the cycle of this strongly connected component $R_2$ (=8) is a multiple of the cycle (=8) of the "cnt" register which is the input register of the strongly connected component $R_2$. As a result, the faithful simulation execution mechanism 2800 related to the strongly connected components $R_1$ and $R_2$ stops all the simulation execution related to the strongly connected component $R_1$ and $R_2$ (including the output mechanism of the "cnt" register activated before) except for the output mechanism of the "divide_clk" register which is the output register of the strongly connected component $R_1$ and $R_2$. That is, only the logic circuit description corresponding to FIGS. 28(A) and 28(B) is executed after time=8. After that, cyclicity related to the strongly connected components $R_3$ and $R_4$ is detected at time=32 similarly, and the simulation execution of the whole circuit can be stopped after time=32.

As described above, according to this embodiment, since parts for which cyclicity have been detected, in the circuit corresponding to the logic circuit description 1100, are sequentially stopped, it is possible to reduce the amount of processing of the circuit itself required until detection of the cyclicity of the whole circuit and therefore shorten the simulation execution time.

The advantages of the speed-up will be described in detail below for each of the first to fifth embodiments.

First, in the first embodiment, since additional processings by the register value monitoring mechanism 2300 and the cyclicity detection mechanism 2500 are required until detection of the cyclicity, more overhead is required in comparison with the case of simply operating only the faithful simulation execution mechanism 2800. However, if "t" in a request 4300 for the register values at time "t" is longer than one cycle, the processing time dependent on the length of the time "t" is not required. Therefore, the larger "t" is, the larger the speed-up effect is.

In the second embodiment, it is necessary to operate the output mechanism even after detection of cyclicity. In this case, an effect of speed-up corresponding to the ratio of the original operation load of the whole circuit to the operation load of the output mechanism can be obtained.

In the third embodiment, it is necessary to resume the operation of the faithful simulation execution mechanism 2800 after the time "t" at which the irregular input signal 4200 occurs. Therefore, though the same speed-up effect as the second embodiment can be obtained in the case where "t" is sufficiently large, the effect is small in the case where "t" is small.

On the other hand, the method of the fourth embodiment in which registers to be monitored are limited has an advantage of reducing overhead required until detection of cyclicity. Since the overhead of the processings by the register value monitoring mechanism 2300 and the cyclicity detection mechanism 2500 is almost in proportion to the number of registers to be monitored, the overhead can be reduced and speed-up can be expected, in proportion to limitation of the registers to be monitored.

Last, in the fifth embodiment, since parts for which cyclicity has been detected, in the circuit corresponding to logic circuit description, are sequentially stopped, it is possible to reduce the amount of processing of the circuit itself required until detection of the cyclicity of the whole circuit, and speed-up can be expected. Though the speed-up effect cannot be obtained in the methods in the first to fourth embodiment in the case where the register values of the whole circuit do not have a cycle, speed-up can be expected in this fifth embodiment because only parts for which cyclicity has been detected, in the whole circuit, can be stopped.

What is claimed is:

1. A simulation execution apparatus comprising:
a receiving unit configured to receive a cyclic signal;
a plurality of registers;
a simulation execution unit configured to execute simulation of a logic circuit model which operates with the use of the cyclic signal and the registers;
a counter configured to count time based on the cyclic signal;
a register value monitoring unit configured to monitor the values of the registers;
a register data recording unit configured to begin recording, in a storage, during the simulation, an entry that includes register data, made up of the values of the registers, in association with the time of the counter when the value of at least one of the registers changes;
a cyclicity detection unit configured to check, during the simulation, whether the register data of the entry recorded by the register data recording unit is identical to register data of a previous entry recorded in the storage, during the simulation, and to report a cyclicity of the register data in the storage when an identical entry is found; and
a stop unit configured to give a stop instruction signal instructing stop of the simulation to the simulation execution unit when the cyclicity of the register data is reported.

2. The apparatus according to claim 1, wherein, when two or more entries with the same register data exist and time difference between the two register data is a multiple of a cycle of the cyclic signal, the cyclicity detection unit reports the cyclicity of the register data.

3. The apparatus according to claim 2, wherein
the receiving unit receives two or more cyclic signals having different cycles; and
the cyclicity detection unit reports the cyclicity of the register data when the time difference between the two register data corresponds to a multiple of each of the cyclic signals.

4. The apparatus according to claim 2, wherein the cyclicity detection unit obtains the time difference between the two register data existing closest to each other in terms of time, as the cycle of the register data.

5. The apparatus according to claim 1, further comprising:
a request signal receiving unit configured to receive a request signal which requests the values of the registers at particular time;
a register value acquisition unit configured to acquire the values of the registers included in the register data of an entry corresponding to the particular time among register data of one cycle associated with reported cyclicity; and
an output unit configured to output the register values acquired by the register value acquisition unit.

6. The apparatus according to claim 1, further comprising a register detection unit configured to detect a first register capable of determining a value from another register based on description of the logic circuit model; wherein
the register data recording unit records an entry that includes register data only for registers different from the first register among the registers but not for the first register.

7. The apparatus according to claim 6, further comprising:
a request signal receiving unit configured to receive a request signal which requests the value of the first register at particular time;

a register value calculation unit configured to calculate the value of the first register with the use of the value of the another register included in the register data corresponding to particular time among the register data of one cycle associated with reported cyclicity; and an output unit configured to output the value of the first register calculated by the register value calculation unit.

8. The apparatus according to claim 1, further comprising a register update unit configured to update an output register of the registers which stores a value to be outputted to an external portion, based on the values of the output register of one cycle associated with reported cyclicity, and one of the cyclic signal and the counter, while the simulation is stopped.

9. The apparatus according to claim 1, further comprising:
a register recovery unit configured to recover the registers with register data of the entry in the storage; and
an input detection unit configured to detect input of an irregular interrupt signal; wherein
the registers include an interrupt register for storing an interrupt value depending on input of the irregular interrupt signal;
the register recovery unit recovers the registers except the interrupt register, with register data corresponding to input time of the irregular interrupt signal among the register data of one cycle associated with reported cyclicity, and stores the interrupt value in the interrupt register; and
the stop unit gives a stop release signal which releases stop of the simulation, to the simulation execution unit.

10. The apparatus according to claim 9, wherein, if the irregular interrupt signal is inputted when the simulation is executed, the register recovery unit clears the register data recording unit and stores the interrupt value in the interrupt register.

11. The apparatus according to claim 1, further comprising a graph generation unit configured to generate an inter-register dependence graph by analyzing the logic circuit model, adding an arc directed from a node indicating a second register to a node indicating a first register if substitution from the second register to the first register exists, and adding an arc directed from a node indicating a third register to the node indicating the first register if the timing of the substitution is determined by the value of the third register; wherein
the cyclicity detection unit reports cyclicity for each of strongly connected components in the inter-register dependence graph; and
the stop unit gives an instruction signal which instructs stop of processing handling registers included in the strongly connected component for which cyclicity has been reported, in the simulation execution to the simulation execution unit.

12. A simulation execution method comprising:
receiving a cyclic signal;
executing simulation of a logic circuit model which operates with the use of the cyclic signal and a plurality of registers;
counting time based on the cyclic signal;
monitoring the values of the registers;
recording, in a storage, during the simulation, an entry that includes register data, made up of the values of the registers in association with the time of the counter on a memory when the value of at least one of the registers changes;
checking, during the simulation, whether the recorded register data of the entry is identical to register data of a previous entry in the storage and reporting a cyclicity of the register data in the storage when an identical entry is found; and
stopping the executing of the simulation when the cyclicity of the register data is reported.

13. The method according to claim 12, wherein, when two or more entries with same register data exist and time difference between the two register data within the entries is a multiple of a cycle of the cyclic signal, the cyclicity of the register data is reported.

14. The method according to claim 13, wherein the reporting a cyclicity includes obtaining the time difference between the two register data existing the closest to each other in terms of time, as the cycle of the register data.

15. The method according to claim 12, further comprising:
receiving a request signal which requests the values of the registers at particular time;
acquiring register data corresponding to the particular time among register data of one cycle associated with reported cyclicity; and
an output unit configured to output the values of the registers included in the register data acquired by the register value acquisition unit.

16. The method according to claim 12, further comprising detecting a first register capable of determining a value from another register based on description of the logic circuit model; wherein
the register data is not recorded for first register and is recorded only for registers different from the first register among the registers.

17. The method according to claim 16, further comprising:
a request signal receiving unit configured to receive a request signal which requests the value of the first register at particular time;
calculating the value of the first register with the use of the value of the another register included in the register data corresponding to particular time among the register data of one cycle associated with reported cyclicity; and
outputting calculated value of the first register.

18. The method according to claim 12, further comprising updating an output register of the registers which stores a value to be outputted to an external portion, based on the values of the output register of one cycle associated with reported cyclicity, and one of the cyclic signal and the counter, while the simulation is stopped.

19. The method according to claim 12, further comprising:
detecting input of an irregular interrupt signal;
recovering the registers except an interrupt register for storing an interrupt value depending on input of the irregular interrupt signal among the registers, with register data corresponding to input time of the irregular interrupt signal among the register data of one cycle associated with the reported cyclicity;
storing the interrupt value in the interrupt register; and
releasing stop of the simulation execution.

20. The method according to claim 12, further comprising generating an inter-register dependence graph by analyzing the logic circuit model, adding an arc directed from a node indicating a second register to a node indicating a first register if substitution from the second register to the first register exists, and adding an arc directed from a node indicating a third register to the node indicating the first register if the timing of the substitution is determined by the value of the third register; wherein
the reporting the cyclicity includes reporting the cyclicity for each of strongly connected components in the inter-register dependence graph; and the stopping includes stopping processing handling registers included in the strongly connected component for which the cyclicity has been reported, in the simulation execution.

21. A computer readable medium storing a computer program for causing a computer to execute instructions to perform the steps of:

receiving a cyclic signal;

executing simulation of a logic circuit model which operates with the use of the cyclic signal and a plurality of registers;

counting time based on the cyclic signal;

monitoring the values of the registers;

recording, in a storage, during the simulation, an entry that includes register data, made up of the values of the registers, in association with the time of the counter on a memory when the value of at least one of the registers changes;

checking, during the simulation, whether the recorded register data of the entry is identical to register data of a previous entry recorded in the storage, during the simulation, and reporting a cyclicity of the register data in the storage when an identical entry is found; and stopping the executing of the simulation when the cyclicity of the register data is reported.

* * * * *